(12) United States Patent
Lee et al.

(10) Patent No.: US 11,348,646 B2
(45) Date of Patent: May 31, 2022

(54) APPARATUS AND METHOD FOR MANAGING PROGRAM OPERATION TIME AND WRITE LATENCY IN MEMORY SYSTEM

(71) Applicant: SK hynix Inc., Gyeonggi-do (KR)

(72) Inventors: Jooyoung Lee, Seoul (KR); Kyumin Lee, Seoul (KR); Changhan Kim, Seoul (KR); Sungkwan Hong, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 15 days.

(21) Appl. No.: 16/920,165

(22) Filed: Jul. 2, 2020

(65) Prior Publication Data

US 2021/0202008 A1 Jul. 1, 2021

(30) Foreign Application Priority Data

Dec. 27, 2019 (KR) .................. 10-2019-0176690

(51) Int. Cl.
*G11C 11/34* (2006.01)
*G11C 16/16* (2006.01)
*G11C 16/26* (2006.01)
*G06F 12/02* (2006.01)
*G11C 16/34* (2006.01)

(52) U.S. Cl.
CPC .......... *G11C 16/16* (2013.01); *G06F 12/0246* (2013.01); *G11C 16/26* (2013.01); *G11C 16/3431* (2013.01); *G06F 2212/7207* (2013.01)

(58) Field of Classification Search
CPC ..... G11C 16/16; G11C 16/3431; G11C 16/26; G06F 12/0246; G06F 2212/7207
USPC ..................................................... 365/185.29
See application file for complete search history.

(56) References Cited

U.S. PATENT DOCUMENTS

| 10,133,480 | B2 * | 11/2018 | Liu ....................... G06F 3/04845 |
| 2011/0055458 | A1 * | 3/2011 | Kuehne ............... G06F 12/0246 711/103 |
| 2014/0226404 | A1 * | 8/2014 | Lee ........................ G11C 16/04 365/185.11 |
| 2016/0259570 | A1 * | 9/2016 | Agarwal ................. G11C 29/76 |
| 2017/0123655 | A1 * | 5/2017 | Sinclair .................. G06F 3/0611 |
| 2018/0059968 | A1 * | 3/2018 | Jung ........................ G06F 3/065 |
| 2018/0373438 | A1 * | 12/2018 | Bennett .................. G06F 3/0608 |

FOREIGN PATENT DOCUMENTS

KR 10-2018-0004874 1/2018

* cited by examiner

*Primary Examiner* — Huan Hoang
*Assistant Examiner* — Minh Dinh
(74) *Attorney, Agent, or Firm* — IP & T Group LLP

(57) ABSTRACT

An operation method of a memory system may include monitoring the size of a programmable area included in each of a plurality of open blocks in which a plurality of data having different attributes are stored, respectively, and generating a first free block by performing a first erase operation on a part of a plurality of erase target blocks based on the number of first open blocks, each open block of which the programmable area has a size less than a threshold value, among the plurality of open blocks.

25 Claims, 13 Drawing Sheets

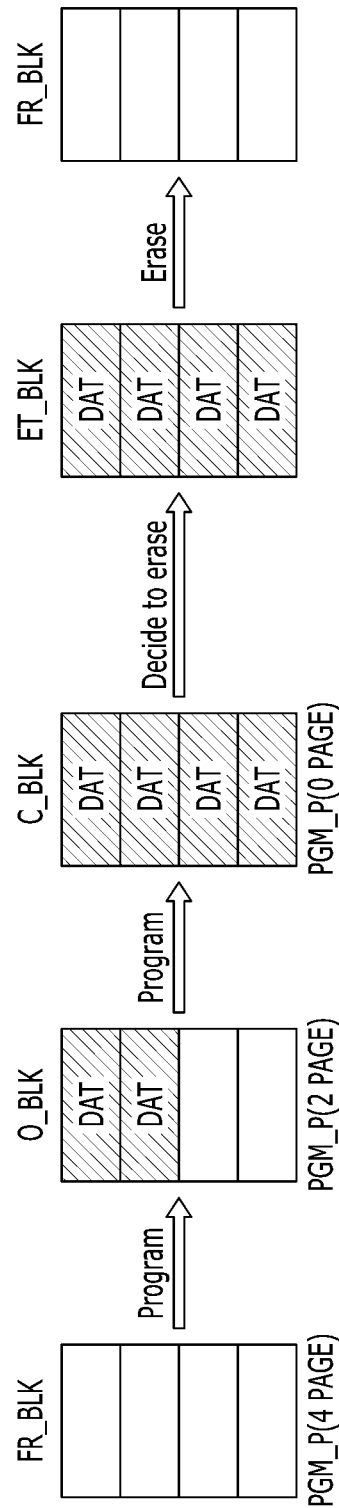

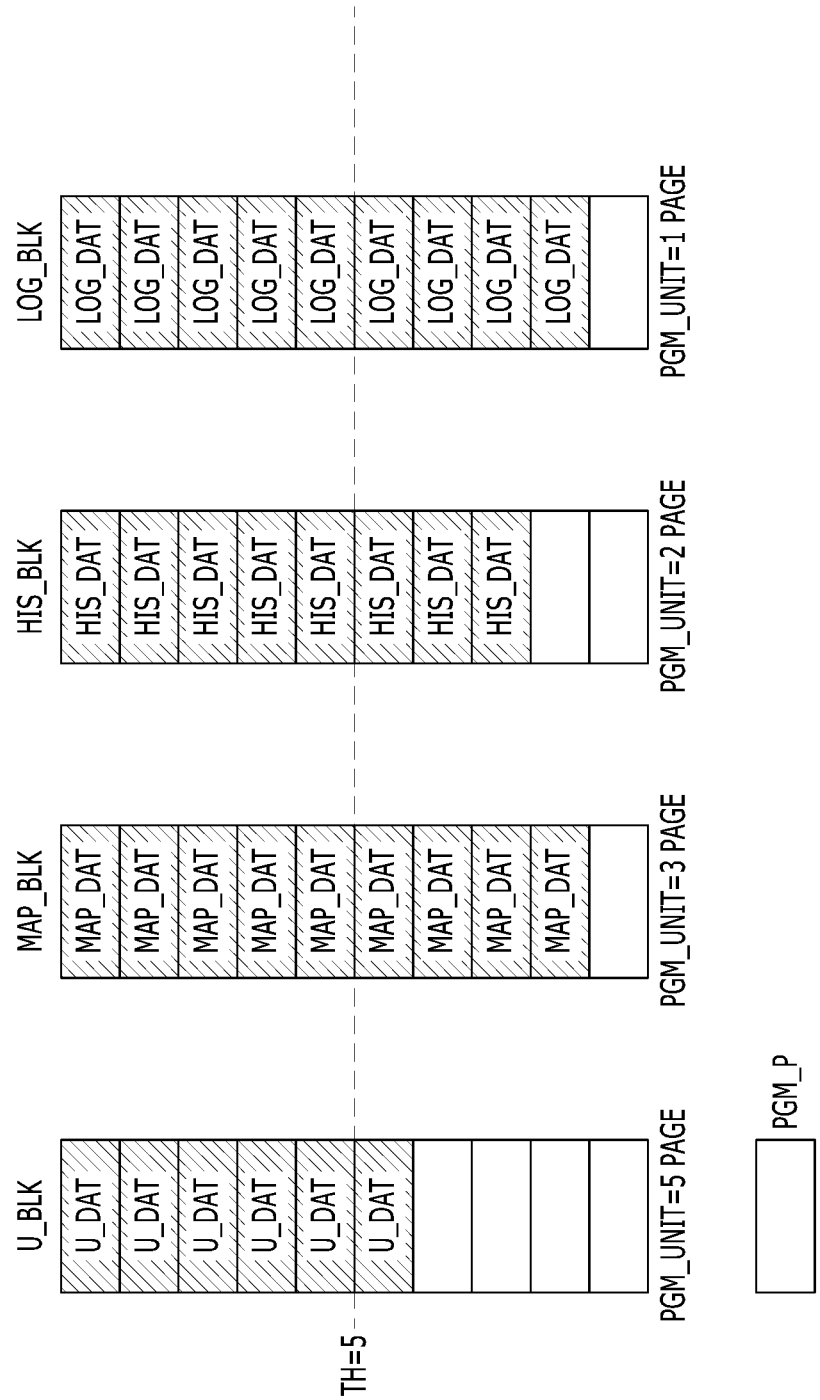

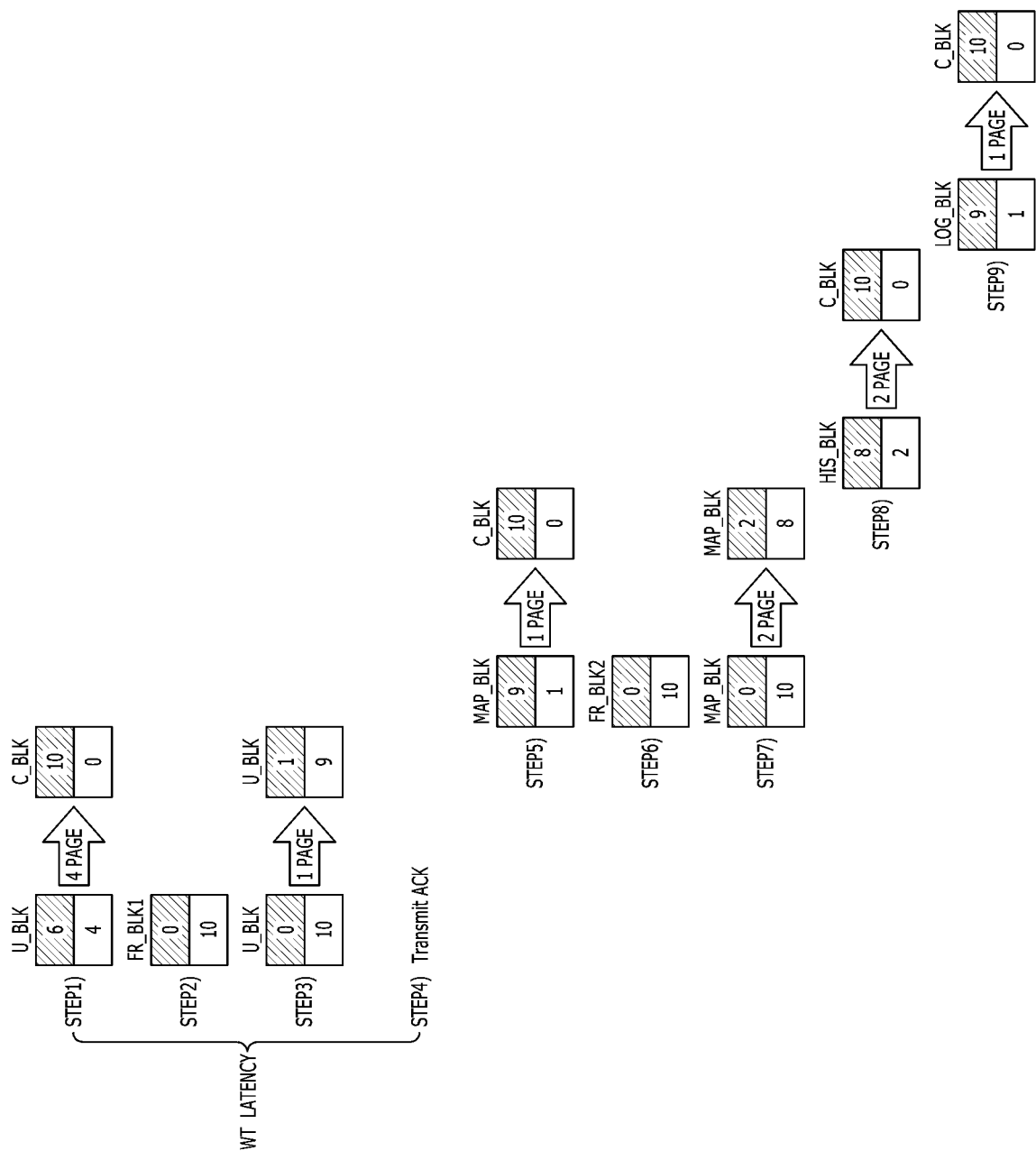

APPARATUS AND METHOD FOR MANAGING PROGRAM OPERATION TIME AND WRITE LATENCY IN MEMORY SYSTEM

CROSS-REFERENCE TO RELATED APPLICATION

This application claims priority under 35 U.S.C. § 119 to Korean Patent Application No. 10-2019-0176690 filed on Dec. 27, 2019, which is incorporated herein by reference in its entirety.

BACKGROUND

1. Field

Embodiments relate to a memory system, and more particularly, to an apparatus and method for managing a program operation time and write latency for a nonvolatile memory device.

2. Discussion of the Related Art

Recently, the paradigm for a computing environment has shifted to ubiquitous computing, which enables computer systems to be accessed virtually anytime and anywhere. As a result, the use of portable electronic devices, such as mobile phones, digital cameras, notebook computers and the like, is rapidly increasing. Such portable electronic devices typically use or include a memory system that uses or embeds at least one memory device, i.e., a data storage device. The data storage device can be used as a main storage device or an auxiliary storage device of a portable electronic device.

Unlike a hard disk, a data storage device using a nonvolatile semiconductor memory device is advantageous in that it has excellent stability and durability because it has no mechanical driving part (e.g., a mechanical arm), has high data access speed, and low power consumption. In the context of a memory system having such advantages, an exemplary data storage device includes a USB (Universal Serial Bus) memory device, a memory card having various interfaces, a solid state drive (SSD) or the like.

SUMMARY

Various embodiments are directed to a method and apparatus which can generate a free block based on the number of prospective closed blocks before performing a program operation for write data, and thus reduce a program operation time and write latency because an erase operation is not performed on an erase target block during the program operation.

Also, various embodiments are directed to a method and apparatus which can generate one or more free blocks, when the number of prospective closed blocks is greater than or equal to two before a program operation for write data is performed, and thus adjust a program operation time to a specific time or less, because an erase operation is not performed on an erase target block during the program operation.

Also, various embodiments are directed to a method and apparatus which can minimize the number of free blocks generated before a program operation in consideration of the characteristics of an erase page whose threshold voltage distribution changes with the elapse of time after an erase operation is performed, thereby improving the reliability of write data to be programmed.

Also, various embodiments are directed to a method and apparatus which can preferentially allocate free blocks to a memory block to which user data is programmed, when the number of free blocks is less than the number of prospective closed blocks before a program operation for write data is performed, thereby reducing a program operation time and write latency of the user data.

Also, various embodiments are directed to a method and apparatus which can previously generate only a free block to be allocated to a prospective closed block which has a small number of programmable pages and on which a program operation is to be performed, thereby improving the reliability of write data while reducing a program operation time and write latency of the write data.

In accordance with embodiments, a memory system and an operation method thereof may generate a free block based on the number of prospective closed blocks before performing a program operation for write data, thereby reducing the program operation time and write latency of the write data.

Furthermore, when the number of prospective closed blocks is greater than or equal to two, the memory system can generate one or more free blocks and allocate the one or more free blocks to the prospective closed blocks, before performing a program operation for write data, thereby reducing the program operation time to a specific time or less.

Furthermore, considering the characteristics of an erase page whose threshold voltage distribution changes with the elapse of time after an erase operation is performed, the memory system may minimize the number of free blocks generated before a program operation is performed, thereby improving the reliability of write data to be programmed.

Furthermore, when the number of free blocks is less than the number of prospective closed blocks before a program operation for write data is performed, the memory system may preferentially allocate a previously generated free block to a memory block to which user data are to be programmed, thereby improving the reliability of write data while reducing the program operation time and write latency of the user data.

Furthermore, before a program operation for write data is performed, the memory system may previously generate only a free block which has a small number of programmable pages and on which a program operation is to be performed soon, thereby improving the reliability of write data while reducing the program operation time and write latency of the user data.

BRIEF DESCRIPTION OF THE DRAWINGS

The above and other features and advantages of the present disclosure will become more apparent to those skilled in the art to which the present disclosure pertains by the following detailed description with reference to the attached drawings.

FIG. 1 is a diagram for describing programmable pages in a memory block in accordance with an embodiment of the present disclosure.

FIGS. 5A and 5B illustrate examples of open blocks in accordance with an embodiment of the present disclosure.

FIG. 9 is a diagram illustrating a memory block in which a program operation is performed in accordance with an embodiment of the present disclosure.

DETAILED DESCRIPTION

Figure 2A:
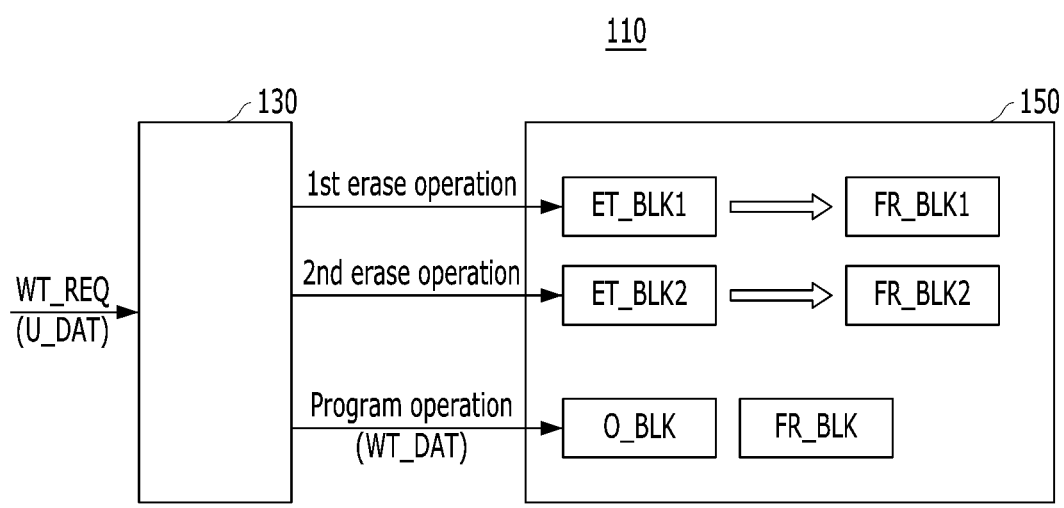
FIGS. 2A to 2C are diagrams for describing an erase operation method performed by a memory system in accordance with an embodiment of the present disclosure.

Hereafter, various embodiments will be described with reference to the accompanying drawings. It should be understood that the following descriptions will be focused on portions required for understanding an operation in accordance with an embodiment, and descriptions of the other portions will be ruled out in order not to unnecessarily obscure subject matters of the present disclosure.

Hereafter, embodiments of the present disclosure will be described in detail with reference to the accompanying drawings.

FIG. 1 illustrates an example of a memory block which is sorted according to a data storage state.

As illustrated in FIG. 1, the memory block may be sorted into a free block FR_BLK, an open block O_BLK, a closed block C_BLK or an erase target block ET_BLK according to the state of data stored in pages of the memory block.

Each memory block may include a group of memory cells which are erased at a time, and correspond to the minimum unit on which an erase operation is performed. Each memory block may include a plurality of pages. Each page may include a group of memory cells from/to which data are read/programmed at a time, and correspond to the minimum unit on which a read/program operation is performed.

A free block FR_BLK may be a memory block including only erase pages from which data are erased. An open block O_BLK may include erase pages to which data can be programmed and program pages in which data are programmed. In an embodiment of the present disclosure, the free block FR_BLK, on which a decision to perform a program operation is made after an erase operation is performed, may be used as the open block O_BLK.

Data may be sequentially programmed to a memory block from the first page to the last page, or from the last page to the first page. When data are programmed to the last page of the corresponding memory block, the memory block is changed from an open block to a closed block. The open block O_BLK may be a memory block to which new data can be programmed, and the closed block C_BLK may be a memory block to which new data cannot be programmed any more without an erase operation. Among closed blocks C_BLK, a memory block on which an erase operation can be performed because the memory block has no valid data stored therein may be the erase target block ET_BLK.

In the descriptions below, "area to which data can be programmed" may include an erased memory cell, sector, page, memory block, plane and memory die in which no data are stored.

Hereafter, by way of example and without any limitation, an erase page having no data stored therein will be taken as an example of "area to which data can be programmed". Similarly, "the number of pages to which data can be programmed" may have the same meaning as "the size of area to which data can be programmed".

A memory block may include one or more programmable page PGM_P. A programmable page PGM_P may include an erase page from which data are erased, and indicate an area to which data can be programmed.

In the illustrated example in FIG. 1, programmable pages PGM_P in the free block FR_BLK may be 'four erase pages'. Furthermore, programmable pages PGM_P in the open block O_BLK may be 'two erase pages'. Furthermore, programmable pages PGM_P in the closed block C_BLK may be 'zero erase page'. That is, the number of programmable pages PGM_P is '0'.

The number of programmable pages PGM_P may indicate areas having no data stored therein, among areas of a page, which are divided according to a preset number of partial program (NOP). The NOP may indicate the number of program operations which can be performed on the same page. In other words, data may not be programmed to one entire page according to the preset NOP, but programmed in area units divided by the preset NOP.

For example, when the NOP is set to one and an amount of data to be programmed is less than the storage capacity of one page, areas of the page, in which no data are programmed, may be filled with dummy data. In this case, the number of programmable pages PGM_P in the page may be '0'.

However, when the NOP is set to four to divide one page into first to fourth areas and an amount of data to be programmed corresponds to the size of data which can be stored in the first area, the second to fourth areas in which no data are programmed may not be filled with dummy data. In this case, the number of programmable pages PGM_P in the page may be '0.75'.

A closed block C_BLK may include only program pages (i.e., DAT). An erase target block ET_BLK may be a memory block on which a controller has decided to perform an erase operation. By way of example and without any limitation, embodiments are based on valid data stored in the erase target block ET_BLK having been already completely copied into the free block FR_BLK.

The above-described memory blocks may be implemented as nonvolatile memories. In this case, the plurality of memory blocks may not support a data overwrite operation. Therefore, in order to perform a program operation on the erase target block ET_BLK, a controller needs to change the erase target block ET_BLK into the free block FR_BLK by performing an erase operation on the erase target block ET_BLK.

When a difference between the time point of an erase operation performed on the erase target block ET_BLK and the time point of a program operation performed on the free block FR_BLK increases, a charge loss, charge gain or the like may occur in memory cells in the free block FR_BLK, with the elapse of time. In this case, the threshold voltage distribution of the memory cells may widen. Thus, an error may occur during a process of programming new data. For this reason, the conventional controller generates the free block FR_BLK by performing an erase operation on the erase target block ET_BLK just before performing a program operation, thereby reducing a difference between the time point of the erase operation and the time point of the program operation. Therefore, the controller can prevent an error of the program operation, which occurs due to the threshold voltage distribution which changes with the elapse of time.

However, when large volume data are to be programmed to a memory device, the number of erase target blocks ET_BLK may be increased. Thus, the erase operation time may be increased to delay the program operation. Therefore, write latency may be increased.

In particular, in a memory device having a nonvolatile memory characteristic, an erase operation requires a longer time than a read or program operation. This may have a large influence on the operation reliability and performance of a memory system.

Hereafter, referring to FIGS. 2A and 2B, an example of an erase operation performed by the memory system in accordance with an embodiment of the present disclosure will be described.

FIG. 2A illustrates an example of a memory system 110 including a memory device 150 and a controller 130 for controlling the memory device 150 in accordance with an embodiment. FIG. 2B shows time points of first and second erase operations which the controller 130 performs on the memory device 150.

As illustrated in FIG. 2A, the memory device 150 may include a plurality of open bocks O_BLK, a plurality of free blocks FR_BLK and a plurality of erase target blocks ET_BLK.

In an embodiment, a program operation according to a write request WT_REQ received from a host may include an operation of programming user data U_DAT to a user open block within the memory device 150. The user data U_DAT may be received with the write request WT_REQ from the host. The program operation according to the write request WT_REQ may further include an operation of programming meta data to a meta open block within the memory device 150. The meta data may be associated with the programmed user data U_DAT. In an embodiment, a program operation time may include a period of time from the time point that the user data U_DAT is received with the write request WT_REQ from the host, to the time point that the write data WT_DAT are completely programmed to the memory device 150. The memory system 110 may transfer an acknowledgment of the write request WT_REQ to the host after the program operation is completed.

In an embodiment, the program operation may include the operation of programming the user data U_DAT, received with the write request WT_REQ from the host, to a user open block within the memory device 150 and the operation of programming the meta data, associated with the programmed user data U_DAT, to a meta open block. The meta data may include map data, history data and log data. In particular, when the write request WT_REQ is a cache-off write request, a force unit access (FUA) write request or a replay protected memory block (RPMB) write request, the memory system 110 may transmit an acknowledgment of the write request WT_REQ to the host, after the user data U_DAT and the meta data are completely programmed.

The open block O_BLK may include a user open block, a map open block, a history open block and a log open block, to which write data WT_DAT are programmed, respectively.

The time required for performing an erase operation on the erase target block ET_BLK may occupy the largest portion of the program operation time. The erase operation may be performed before each of user data, map data, history data and log data is programmed. In particular, in order to prevent deep-erase of erase pages in the erase target block ET_BLK, a pre-program operation of dummy data may be performed on the erase pages. During the pre-program operation, a program voltage may be applied to word lines of the erase pages, and a pass voltage may be applied to a drain select line and a string select line. Threshold voltages of memory cells of the erase pages in the erase target block ET_BLK may be increased by a predetermined level through the pre-program operation. Thus, the erase operation time of the erase target block ET_BLK may be increased by the pre-program operation time of the dummy data as well as the erase operation time of the data.

In particular, the higher the number of open blocks to which write data are to be programmed and the number of prospective close blocks which are included in the open blocks and have a small number of programmable pages, the longer the program operation time may be required. For example, when an insufficient number of programmable pages are included in each of four open blocks, i.e. the user open block, the map open block, the history open block and the log open block, the controller 130 needs to perform an erase operation on the four erase target blocks ET_BLK. At this time, the program operation time required for programming a plurality of different write data may be increased by the erase operation time required for performing the erase operation on the four erase target blocks ET_BLK.

Thus, when the open blocks O_BLK in the memory device 150 include an insufficient number of programmable pages, the controller 130 may generate a first free block FR_BLK1 by performing a first erase operation on at least one first erase target block ET_BLK1 of the plurality of erase target blocks ET_BLK in advance. Therefore, the controller 130 may reduce delay which may be caused by a second erase operation performed on a second erase target block ET_BLK2 of the plurality of erase target blocks ET_BLK, when a program operation for write data WT_DAT is performed. Thus, the program operation time required for programming a plurality of different write data may be reduced. For example, the first erase operation may include a data erase operation which is previously performed on the first erase target block ET_BLK1 which is a part of the plurality of erase target blocks ET_BLK, before a closed block is generated by a program operation. On the other hand, the second erase operation may include a data erase operation which is performed on the second erase target block ET_BLK2 which is another part of the plurality of erase target blocks ET_BLK, not the first erase target block ET_BLK1, after a closed block is generated by a program operation or at the time point when it is determined that a new memory block is necessary for a program operation.

Figure 2B:
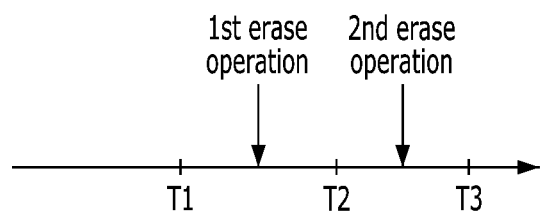

Referring to FIG. 2B, a first time point T1 may correspond to the time point that the controller 130 determines that the number of programmable pages in each of the open blocks O_BLK is not sufficient. That is, when the number of programmable pages in an open block O_BLK is less than a preset threshold value, the controller 130 may determine that the corresponding open block O_BLK is a prospective closed block which includes an insufficient number of programmable pages to which data are to be programmed or is highly likely to become a closed block soon. Hereafter, a prospective closed block including programmable pages less than the threshold value, among the open blocks O_BLK, will be referred to as 'first open block'.

A second time point T2 may correspond to the time point that the controller 130 determines that the number of programmable pages in each of the open blocks O_BLK in which the write data WT_DAT are to be stored is not sufficient, immediately before programming the write data WT_DTA according to the write request WT_REQ received from the host.

A third time point T3 may correspond to the time point that the controller 130 programs the write data WT_DAT.

In an embodiment, the controller 130 may generate the first free block FR_BLK1 by performing the first erase operation on the first erase target block ET_BLK1 which is a part of the plurality of erase target blocks, between the first time point T1 and the second time point T2. Furthermore, the controller 130 may generate a second free block FR_BLK2 by performing the second erase operation on the second erase target block ET_BLK2 on which the first erase operation is not performed, between the second time point T2 and the third time point T3. As described above, the first and second erase operations may be performed on different erase target blocks at different time points.

The conventional memory system has performed only the second erase operation between the second and third time points T2 and T3. In an embodiment, the controller 130 may perform the first erase operation on the first erase target block ET_BLK1 between the first and second time points T1 and T2, and perform the second erase operation on the second erase target block ET_BLK2 between the second and third time points T2 and T3.

In some embodiments, the first erase operation may include a background operation of the memory system 110, which is performed regardless of a request of the host. The second erase operation may include a background operation of the memory system 110, which is performed according to a write request of the host.

In some embodiments, the controller 130 may decide whether to perform the first erase operation, and decide the number of erase target blocks ET_BLK on which the first erase operation is to be performed, in order to reduce the program operation time. This operation may correspond to an operation of deciding whether to generate the first free blocks FR_BLK1 and deciding the number of first free blocks FR_BLK1 to be generated. For this operation, the controller 130 may increase a threshold value and the number of first free blocks to be generated, and decrease a reference value.

In some embodiments, the threshold value may include the number of programmable pages for determining a first open block in the open blocks O_BLK. For example, when the number of programmable pages in an open block O_BLK is less than the threshold value, the controller 130 may determine that the corresponding open block O_BLK is the first open block. The controller 130 may set the threshold value based on the program unit of write data WT_DAT. The program unit may indicate the number of pages which are programmed by one program operation according to the type or characteristic of data. For example, when log data are programmed at a time by a size corresponding to one page, the program unit of the log data may correspond to one page.

Furthermore, when user data are programmed at a time by a size corresponding to five pages, the program unit of the user data may correspond to five pages. In an embodiment, the number of pages programmed by one program operation may be different depending on the type or characteristic of data programmed to the memory device 150. The controller 130 may set the threshold value based on the program unit of write data WT_DAT.

In some embodiments, the reference value may include the number of first open blocks for deciding whether to perform the first erase operation. For example, the controller 130 may perform the first erase operation when the number of first open blocks is greater than or equal to the reference value.

That is, when the threshold value is increased, the controller 130 may determine that a certain block is the first open block, even though the certain block includes a large number of programmable pages. At this time, the threshold value may be set to a value N times greater than the program unit of the write data WT_DAT, where N is a natural number greater than or equal to 1. For example, when the threshold value is set to a value equal to the program unit of the write data WT_DAT, the first open block may become a closed block through one program operation for programming the write data WT_DAT to the first open block. Furthermore, when the threshold value is set to a value twice greater than the program unit of the write data WT_DAT, the first open block may become a closed block through two program operations for programming the write data WT_DAT to the first open block. That is, when the threshold value is set to a value twice greater than the program unit of the write data WT_DAT, the first open block may not become a closed block through one program operation. However, the controller 130 may determine that the first open block is a prospective closed block, and allocate the first free block FR_BLK1.

For example, a first case in which the threshold value is set to a value three times greater than the program unit of the write data WT_DAT and a second case in which the threshold value is set to a value twice greater than the program unit of the write data WT_DAT may be compared.

Based on the time point that a program operation is performed on the first free block FR_BLK1, the first erase operation in the first case may be performed earlier and more frequently than the first erase operation in the second case. Furthermore, as the threshold value is increased, it can be expected that more open blocks will be switched to close blocks. Thus, the first erase operation may be performed on more erase target blocks. When the threshold value is set to a large value in the case that a large number of open blocks are present, the first erase operation may be previously and frequently performed. Then, during a program operation, delay caused by the second erase operation may be reduced.

When the reference value is decreased, the controller 130 may perform the first erase operation for generating the first free block FR_BLK1 even though the number of first open blocks is small. When the reference value is set to a small value in the case that the number of open blocks is large, the first erase operation may be previously and frequently performed. Then, during a program operation, delay caused by the second erase operation may be reduced. When the program operation time is reduced, the controller 130 may be highly likely to complete the program operation within host latency. In an embodiment, the host latency may include a period of time from the time point that the host transmits the write request WT_REQ with the user data U_DAT to the memory system 110 to the time point that the host receives an acknowledgment of the write request WT from the memory system 110. The host latency may be decided by the host according to the size of the user data U_DAT, and correspond to a time which is already decided between the host and the memory system 110.

When the number of first open blocks is large, the controller 130 may reduce the write latency by reducing the program operation time, and thus generate a large number of first free blocks FR_BLK1 in order to transmit an acknowledgment within the host latency.

When the number of first open blocks is not large, the controller 130 does not need to generate the first free blocks FR_BLK1. Although the controller 130 generates the first free blocks FR_BLK1, the controller 130 may generate only a minimum of first free blocks FR_BLK1 in consideration of a change in threshold voltage distribution of memory cells with time.

Thus, in an embodiment, the controller 130 may generate only one first free block FR_BLK1 such that the program operation time does not have the maximum value. That is, when the number of first open blocks, among a plurality of different open blocks to which write data WT_DAT are to be programmed, is greater than or equal to two, the controller 130 may perform the first erase operation only on one first erase target block ET_BLK1. Therefore, after a write request is received from the host, the controller 130 may perform the second erase operation on the second erase target blocks ET_BLK2 corresponding to the number of the plurality of open blocks in order to program the write data WT_DAT, thereby preventing the worst case in which the program operation time has the maximum value.

Figure 2C:
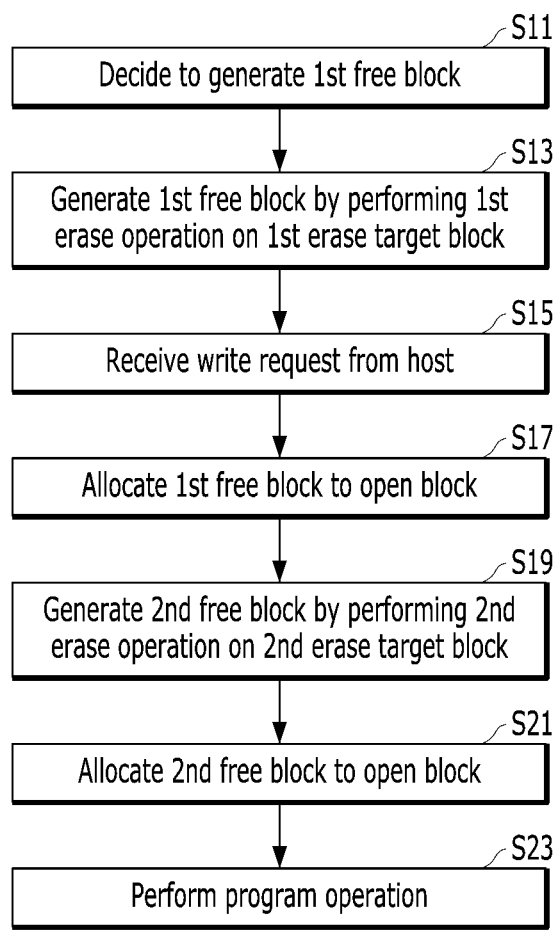

Referring to FIGS. 2B and 2C, in step S11, the memory system 110 may decide to generate the first free block FR_BLK1 at the first time point T1. The first time point T1 may include the time point that the memory system 110 determines that the number of programmable pages in each of the open blocks O_BLK in which user data and meta data are to be stored is not sufficient. This operation of step S11 is described below in steps S110 and S120 of FIGS. 6A, 6B and 7A.

In step S13, the memory system 110 may generate the first free block FR_BLK1 by performing the first erase operation on the first erase target block. This operation of step S13 is described below in steps S130 and S150 of FIGS. 6A, 6B and 7A.

In step S15, a write request may be received from the host. When a program operation is performed according to the write request, the memory system 110 may allocate the previously generated first free block FR_BLK1 to an open block in step S17. Operations of steps S15 and S17 are described in detail below with reference to FIG. 9.

Then, the memory system 110 may decide to generate the first free block FR_BLK1 at the second time point T2 after performing a program operation on the first free block FR_BLK1 in step S17. The second time point T2 may include the time point that the memory system 110 determines that the number of programmable pages in each of the open blocks O_BLK in which user data and meta data are to be stored is not sufficient, during the program operation.

In step S19, the memory system 110 may generate the second free block FR_BLK2 by performing the second erase operation on the second erase target block. This operation of step S19 is described below in steps S110 and S120 of FIGS. 6A, 6B and 7A.

In step S21, the memory system 110 may allocate the generated second free block FR_BLK2 to an open block. In step S23, the memory system 110 may perform a program operation on the second free block FR_BLK2. Operations of steps S21 and S23 are described below in detail with reference to FIG. 8.

Figure 3:
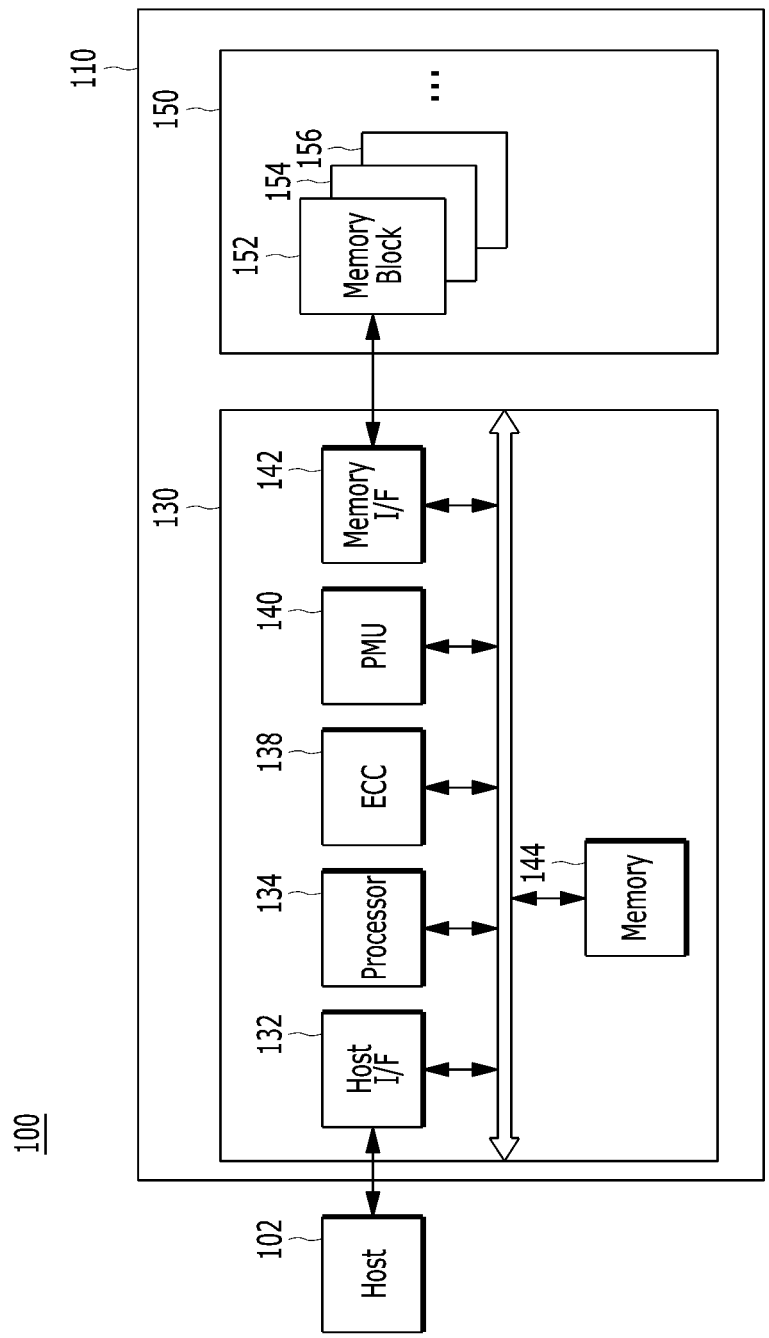
FIG. 3 illustrates a configuration of a data processing system including a memory system according to an embodiment of the present disclosure.

FIG. 3 is a block diagram illustrating a data processing system 100 according to an embodiment of the present disclosure.

Referring to FIG. 3, the data processing system 100 may include a host 102 engaged or operably coupled to a memory system 110.

The host 102 may include, for example, a portable electronic device such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS can provide interoperability between the host 102 engaged with the memory system 110 and the user needing and using the memory system 110. The OS may support functions and operations corresponding to user's requests. By way of example but not limitation, the OS can be a general operating system or a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix and the like. Further, the mobile operating system may include an Android, an iOS, a Windows mobile and the like. The mobile operating system may be subject to support services or functions for mobility (e.g., a power saving function). The host 102 may include a plurality of operating systems. The host 102 may execute multiple operating systems, corresponding to a user's request. The host 102 may transmit a plurality of commands corresponding to the user's requests to the memory system 110, thereby performing operations corresponding to commands within the memory system 110. Handling plural commands in the memory system 110 is described below.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device. The controller 130 and memory device 150 may be so integrated into an SSD to improve an operation speed. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (e.g., SM, SMC), a memory stick, a multimedia card (e.g., MMC, RS-MMC, MMCmicro), a secure digital (SD) card (e.g., SD, miniSD, microSD, SDHC), a universal flash memory or the like. The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device that retains stored data even when electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes a plurality of memory blocks. In addition, the memory device 150 may be a non-volatile memory device, for example a flash memory, wherein the flash memory may be a three-dimensional stack structure.

The controller 130 may control overall operations of the memory device 150, such as read, write, program, and erase operations. For example, the controller 130 may control the memory device 150 in response to a request from the host 102. The controller 130 may provide the data, read from the memory device 150, to the host 102. The controller 130 may store the data, provided by the host 102, into the memory device 150.

The controller 130 may include a host interface (I/F) 132, a processor 134, an error correction code (ECC) component 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and/or integrated drive electronics (IDE). According to an embodiment, the host interface 132 exchanges data with the host 102, which may be implemented through firmware called a host interface layer (HIL).

The ECC component 138 may correct error bits of the data to be processed in (e.g., outputted from) the memory device 150, which may include an ECC encoder and an ECC decoder. Here, the ECC encoder may perform error correction encoding of data to be programmed in the memory device 150 to generate encoded data to which a parity bit is added and store the encoded data in memory device 150. The ECC decoder may detect and correct errors contained in a data read from the memory device 150 when the controller 130 reads the data stored in the memory device 150. In other words, after performing error correction decoding on the data read from the memory device 150, the ECC component 138 may determine whether the error correction decoding has succeeded and output an instruction signal (e.g., a correction success signal or a correction fail signal). The ECC component 138 may use the parity bit which is generated during the ECC encoding process, for correcting the error bit of the read data. When the number of error bits is greater than or equal to a threshold number of correctable error bits, the ECC component 138 may not correct error bits but instead may output an error correction fail signal indicating failure in correcting the error bits.

The ECC component 138 may perform an error correction operation based on a coded modulation, such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), and/or a Block coded modulation (BCM). The ECC component 138 may include any and all circuits, modules, systems or devices for performing the error correction operation based on at least one of the above described codes.

The PMU 140 may manage, control or provide an electrical power provided in the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 may provide an interface for handling commands and data between the controller 130 and the memory device 150, for example, operations of a NAND flash interface, in particular, operations between the controller 130 and the memory device 150. According to an embodiment, the memory interface 142 may be implemented through firmware called a flash interface layer (FIL) as a component for exchanging data with the memory device 150.

The memory 144 may support operations performed by the memory system 110 and the controller 130. The memory 144 may store temporary or transactional data for operations in the memory system 110 and the controller 130. The controller 130 may control the memory device 150 in response to a request from the host 102. The controller 130 may deliver data read from the memory device 150 to the host 102. The controller 130 may store data entered through the host 102 within the memory device 150. The memory 144 may be used to store data for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 3 exemplifies the second memory 144 disposed within the controller 130, the present invention is not limited thereto. That is, the memory 144 may be located within or external to the controller 130. For instance, the memory 144 may be embodied by an external volatile memory having a memory interface transferring data and/or signals between the memory 144 and the controller 130.

The memory 144 may store data for performing operations such as data writing and data reading requested by the host 102, and/or data transfer between the memory device 150 and the controller 130 for background operations such as garbage collection and wear levelling as described above. According to an embodiment, for supporting operations in the memory system 110, the memory 144 may include a program memory, a data memory, a write buffer/cache, a read buffer/cache, a data buffer/cache, a map buffer/cache, and the like.

The memory 144 may store map data and state information. Map data includes logical-to-physical (L2P) map data comprising L2P segments including a logical address used in the host 102 and a physical address of the memory device 150 corresponding to the logical address. Map data may further include physical-to-logical (P2L) map data comprising P2L segments including the physical address used and the logical address corresponding to the physical address.

According to an embodiment, when an erase request E_REQ with the first logical address from the host 102 is received, the controller 130 correlates the first logical address from the host 102 to erase information E_INF including an erased physical address EPA or an erased state value EV. At this time, the controller 130 may perform an unmap operation to the first logical address by invalidating a physical address mapped to the first logical address in the map data. Then the controller 130 maps the first logical address to an erased physical address EPA or an erased state value EV in the map data.

In addition, the memory 144 may store state information as well as controller map data. The state information may include dirty information, invalid address information, valid storage element information, free block number information, and erased state information. The memory system 110 may determine validity of a physical address and a logical address received with an erase request E_REQ from the host 102 using dirty information or invalid address information. In an embodiment of the present disclosure, when the erase request E_REQ is received with the logical address, the controller 130 updates an erase state information of the logical address to have an erase state value EV. In addition, the memory system 110 may invalidate a physical address corresponding to a logical address of the erase request E_REQ, and then change the valid page count VPC of the memory block corresponding to the invalidated physical address. In addition, the memory system 110 may perform garbage collection on a memory block having a number of valid pages less than a set number. When the free block number information is less than or equal to a set number, the memory system 110 may perform garbage collection.

The processor 134 may be implemented with a microprocessor and/or a central processing unit (CPU). The memory system 110 may include one or more processors 134. The processor 134 may control the overall operations of the memory system 110. By way of example but not limitation, the processor 134 may control a program operation or a read operation of the memory device 150, in response to a write request or a read request entered from the host 102. According to an embodiment, the processor 134 may use or execute firmware to control the overall operations of the memory system 110. Herein, the firmware may be referred to as a flash translation layer (FTL). The FTL may perform an operation such as, an interface between the host 102 and the memory device 150. The host 102 may transmit requests for write and read operations to the memory device 150 through the FTL.

The FTL may manage operations of address mapping, garbage collection, wear-leveling and the like. Particularly, the FTL may load, generate, update, or store map data. Therefore, the controller 130 may map a logical address, which is entered from the host 102, with a physical address of the memory device 150 through the map data. The memory device 150 may act like a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the previous particular page to the another newly programed page) due to a characteristic of a flash memory device. Further, the controller 130 may store map data of the new data into the FTL.

For example, when performing an operation requested from the host 102 in the memory device 150, the controller 130 uses the processor 134. The processor 134 may handle instructions or commands corresponding to an inputted command from the host 102. The controller 130 may perform a foreground operation as a command operation, corresponding to a command inputted from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation includes copying data stored in a memory block among the memory blocks 152 to 156 in the memory device 150 to another memory block, e.g., a garbage collection (GC) operation. The background operation may include moving or swapping data stored in at least one of the memory blocks 152 to 156 into at least another of the memory blocks 152 to 156, e.g., a wear leveling (WL) operation. During a background operation, the controller 130 may use the processor 134 for storing the map data stored in the controller 130 to at least one of the memory blocks 152 to 156 in the memory device 150, e.g., a map flush operation. A bad block management operation of checking or searching for bad blocks among the memory blocks 152 to 156 is another example of a background operation performed by the processor 134.

In the memory system 110, the controller 130 performs a plurality of command operations corresponding to a plurality of commands entered from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 may determine which channel(s) or way(s) among a plurality of channels (or ways) for connecting the controller 130 to a plurality of memory dies included in the memory 150 is/are proper or appropriate for performing each operation. The controller 130 may send or transmit data or instructions via determined channels or ways for performing each operation. The plurality of memory dies in the memory 150 may transmit an operation result via the same channels or ways, respectively, after each operation is complete. Then, the controller 130 may transmit a response or an acknowledge signal to the host 102. In an embodiment, the controller 130 may check a status of each channel or each way. In response to a command entered from the host 102, the controller 130 may select at least one channel or way based on the status of each channel or each way so that instructions and/or operation results with data may be delivered via selected channel(s) or way(s).

By way of example but not limitation, the controller 130 may recognize statuses regarding a plurality of channels (or ways) associated with a plurality of memory dies in the memory device 150. The controller 130 may determine the state of each channel or each way as a busy state, a ready state, an active state, an idle state, a normal state and/or an abnormal state. The controller's determination of which channel or way an instruction (and/or a data) is delivered through may be associated with a physical block address, e.g., which die(s) the instruction (and/or the data) is delivered to. The controller 130 may refer to descriptors delivered from the memory device 150. The descriptors may include a block or page of parameters that describe something about the memory device 150, which is data with a specific format or structure. For instance, the descriptors may include device descriptors, configuration descriptors, unit descriptors, and the like. The controller 130 may refer to, or use, the descriptors to determine which channel(s) or way(s) an instruction or a data is exchanged with.

A management unit (not shown) may be included in the processor 134. The management unit may perform bad block management of the memory device 150. The management unit may find bad memory blocks in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

Figure 4:
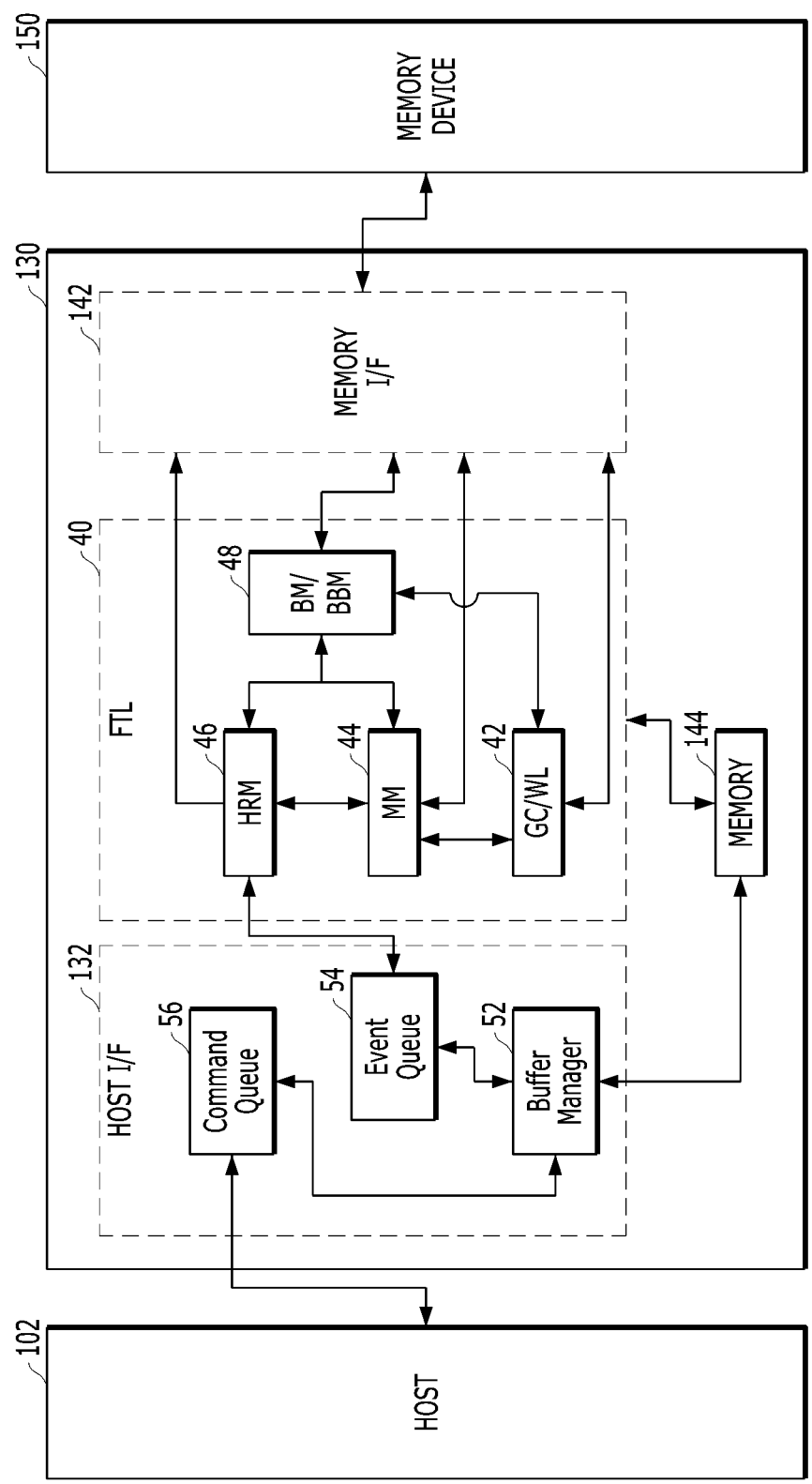
FIG. 4 illustrates a configuration of a memory system according to an embodiment of the present disclosure.

Referring to FIG. 4, a controller in a memory system is described in detail. The memory system in FIG. 4 may correspond to the memory system 110 in FIG. 3. The controller 130 cooperates with the host 102 and the memory device 150. As illustrated, the controller 130 includes a host interface 132, a flash translation layer (FTL) 40, as well as the host interface 132, the memory interface 142 and the memory 144 previously identified in connection with FIG. 3.

Although not shown in FIG. 4, the ECC component 138 described in FIG. 3 may be included in the flash translation layer 40. In another embodiment, the ECC component 138 may be implemented as a separate module, a circuit, firmware or the like, which is included in, or associated with, the controller 130.

The host interface 132 is for handling commands, data, and the like transmitted from the host 102. By way of example but not limitation, the host interface 132 may include a command queue 56, a buffer manager 52 and an event queue 54. The command queue 56 may sequentially store commands, data, and the like received from the host 102 and output them to the buffer manager 52 in order in which they are stored. The buffer manager 52 may classify, manage or adjust the commands, the data, and the like, which are received from the command queue 56. The event queue 54 may sequentially transmit events for processing the commands, the data, and the like received from the buffer manager 52.

A plurality of commands or data of the same characteristic, e.g., read or write commands, may be transmitted from the host 102, or commands and data of different characteristics may be transmitted to the memory system 110 after being mixed or jumbled by the host 102. For example, a plurality of commands for reading data (i.e., read commands) may be delivered, or read commands and commands for programming or writing data (i.e., write commands) may be alternately transmitted to the memory system 110. The host interface 132 may store commands and data, which are transmitted from the host 102, to the command queue 56 sequentially. Thereafter, the host interface 132 may estimate or predict what type of internal operation the controller 130 will perform according to the characteristics of commands and data, which have been received from the host 102. The host interface 132 may determine a processing order and a priority of commands and data, based at least on their characteristics. According to characteristics of commands and data, the buffer manager 52 is configured to determine whether the buffer manager 52 should store commands and data in the memory 144, or whether the buffer manager 52 should deliver the commands and the data into the flash translation layer 40. The event queue 54 receives events, entered from the buffer manager 52, which are to be internally executed and processed by the memory system 110 or the controller 130 in response to the commands and the data, to deliver the events into the flash translation layer 40 in the order received.

According to an embodiment, the host interface 132 may perform some functions of the controller 130 described in FIG. 3.

According to an embodiment, the flash translation layer 40 may include a host request manager (HRM) 46, a map manager (MM) 44, a state manager (GC/WL) 42 and a block manager (BM/BBM) 48. The host request manager 46 may manage the events entered from the event queue 54. The map manager 44 may handle or control map data. The state manager 42 may perform garbage collection (GC) or wear leveling (WL). The block manager 48 may execute commands or instructions on a block in the memory device 150.

By way of example but not limitation, the host request manager 46 may use the map manager 44 and the block manager 48 to handle or process requests according to the read and program commands, and events which are delivered from the host interface 132. The host request manager 46 may send an inquiry request to the map data manager 44, to determine a physical address corresponding to the logical address which is entered with the events. The host request manager 46 may send a read request with the physical address to the memory interface 142, to process the read request (handle the events). Furthermore, the host request manager 46 may send a program request (or write request) to the block manager 48, to program data to a specific empty page (currently having no data) in the memory device 150. Then, the host request manager 46 may transmit a map update request corresponding to the program request to the map manager 44, to update an item relevant to the programmed data in information of mapping the logical-to-physical addresses to each other.

Here, the block manager 48 may convert a program request delivered from the host request manager 46, the map data manager 44, and/or the state manager 42 into a flash program request used for the memory device 150, to manage flash blocks in the memory device 150. In order to enhance program or write performance of the memory system 110, the block manager 48 may collect program requests and send flash program requests for multiple-plane and one-shot program operations to the memory interface 142. In an embodiment, the block manager 48 sends several flash program requests to the memory interface 142 to enhance parallel processing of the multi-channel and multi-directional flash controller.

Additionally, the block manager 48 may be configured to manage blocks in the memory device 150 according to the number of valid pages, select and erase blocks having no valid pages when a free block is needed, and select a block including the least number of valid pages when it is determined that garbage collection is necessary. The state manager 42 may perform garbage collection to move the valid data to an empty block and erase the blocks containing the moved valid data so that the block manager 48 may have enough free blocks (empty blocks with no data). If the block manager 48 provides information regarding a block to be erased to the state manager 42, the state manager 42 may check all flash pages of the block to be erased to determine whether each page is valid. For example, to determine validity of each page, the state manager 42 may identify a logical address recorded in an out-of-band (OOB) area of each page. To determine whether each page is valid, the state manager 42 may compare the physical address of the page with the physical address mapped to the logical address obtained from the inquiry request. The state manager 42 sends a program request to the block manager 48 for each valid page. A mapping table may be updated through the update of the map manager 44 when the program operation is complete.

The map manager 44 may manage a logical-to-physical mapping table. The map manager 44 may process requests such as queries and updates, which are generated by the host request manager 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

Moreover, when garbage collection is performed, the state manager 42 copies valid page(s) into a free block, and the host request manager 46 may program the latest version of the data for the same logical address of the page and currently issue an update request. When the state manager 42 requests the map update in a state in which copying of valid page(s) is not completed normally, the map manager 44 may not perform the mapping table update. It is because the map request is issued with old physical information when the state manger 42 requests a map update and a valid page copy is completed later. The map manager 44 may perform a map update operation to ensure accuracy only when the latest map table still points to the old physical address.

According to an embodiment, at least one of the state manager 42, the map manager 44 or the block manager 48 may include circuitry for performing its own operation. As used in this disclosure, the term 'circuitry' refers to any and all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even when the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and when applicable to a particular claim element, an integrated circuit for a storage device.

Figure 5A:
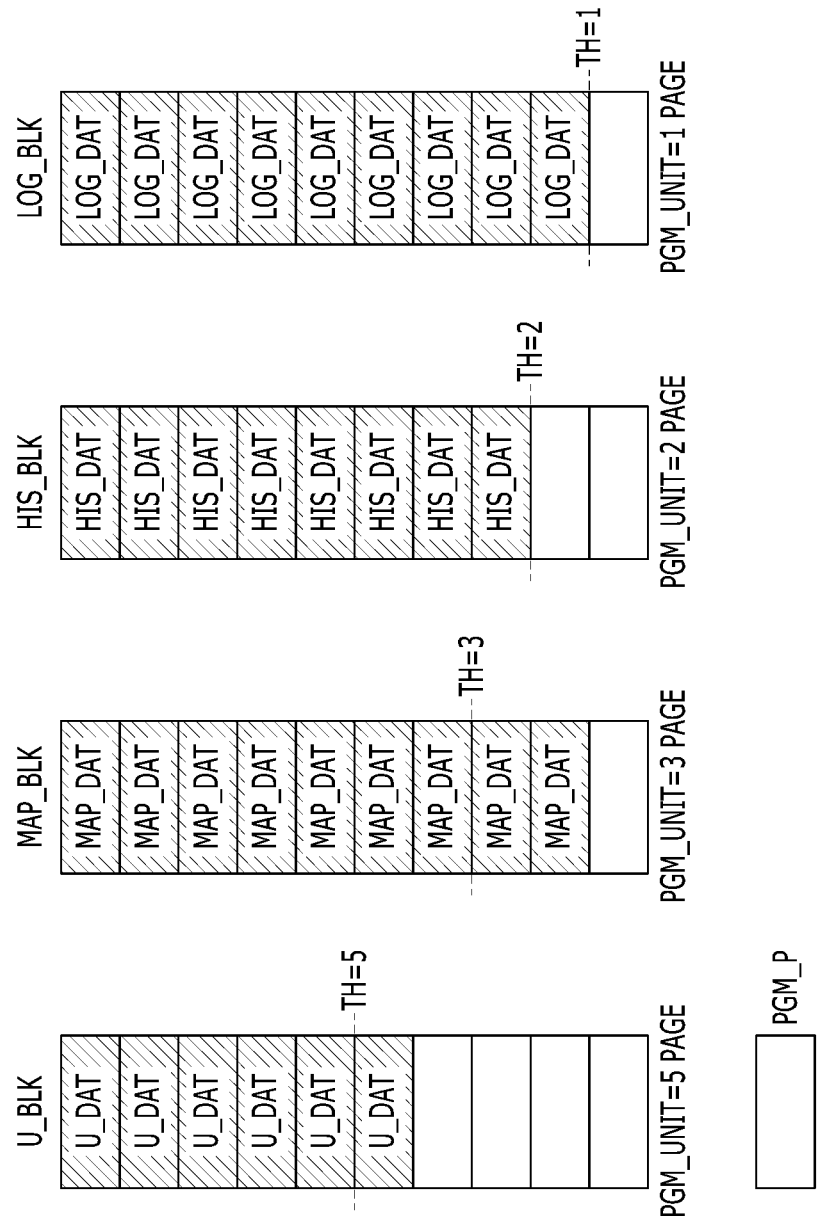

The memory device 150 may include a plurality of memory blocks. The plurality of memory blocks may be any of different types of memory blocks such as a single level cell (SLC) memory block or a multi level cell (MLC) Cell) memory block, according to the number of bits that can be stored or represented in one memory cell. Here, the SLC memory block includes a plurality of pages implemented by memory cells, each storing one bit of data. The SLC memory block may have high data I/O operation performance and high durability. The MLC memory block includes a plurality of pages implemented by memory cells, each storing multi-bit data (e.g., two bits or more). The MLC memory block can have larger storage capacity for the same space compared to the SLC memory block. The MLC memory block can be highly integrated in a view of storage capacity. In an embodiment, the memory device 150 may be implemented with MLC memory blocks such as an MLC memory block, a triple level cell (TLC) memory block, a quadruple level cell (QLC) memory block and a combination thereof. The MLC memory block may include a plurality of pages implemented by memory cells, each capable of storing 2-bit data. The triple level cell (TLC) memory block can include a plurality of pages implemented by memory cells, each capable of storing 3-bit data. The quadruple level cell (QLC)

memory block can include a plurality of pages implemented by memory cells, each capable of storing 4-bit data. In another embodiment, the memory device 150 may be implemented with a block including a plurality of pages implemented by memory cells, each capable of storing 5-bit or more bit data. FIGS. 5A and 5B illustrate examples of a plurality of open blocks in accordance with the present embodiment. The plurality of open blocks O_BLK illustrated in FIG. 5A may have threshold values TH set to different values, respectively, and the plurality of open blocks O_BLK illustrated in FIG. 5B may have threshold values TH set to the same value.

A plurality of different write data WT_DAT may be stored in the plurality of open blocks U_BLK, MAP_BLK, HIS_BLK and LOG_BLK illustrated in FIGS. 5A and 5B, respectively.

The user data block U_BLK may be a memory block in which user data U_DAT received with a write request WT_REQ from the host 102 are stored. The meta data block M_BLK may be a memory block in which meta data M_DAT associated with the attributes, contents and storage locations of the user data U_DAT are stored. The meta data block M_BLK may include a map block MAP_BLK in which map data MAP_DAT including physical location information on the user data U_DAT are stored. The map data MAP_DAT may include a logical address used in the host and a physical address used in the memory device 150.

The meta data block M_BLK may further include a history block HIS_BLK for storing history data HIS_DAT including the physical addresses of locations in which the map data MAP_DAT are stored, and a log block LOG_BLK for storing log data LOG_DAT including the physical addresses of locations in which the history data HIS_DAT are stored.

In FIGS. 5A and 5B, the program unit PGM_UNIT of the user data U_DAT may correspond to a size of 'five pages'. The program unit PGM_UNIT of the map data MAP_DAT may correspond to a size of 'three pages'. The program unit PGM_UNIT of the history data HIS_DAT may correspond to a size of 'two pages'. The program unit PGM_UNIT of the log data LOG_DAT may correspond to a size of 'one page'.

In FIGS. 5A and 5B, the number of programmable pages PGM_P which are included in the user open block U_BLK and have no user data U_DAT stored therein may be 'four'. The number of programmable pages PGM_P which are included in the map open block MAP_BLK and have no map data MAP_DAT stored therein may be 'one'. The number of programmable pages PGM_P which are included in the history open block HIS_BLK and have no history data HIS_DAT stored therein may be 'two'. The number of programmable pages PGM_P which are included in the log open block LOG_BLK and have no log data LOG_DAT stored therein may be 'one'.

Referring to FIG. 5A, the threshold values TH of the respective open blocks U_BLK, MAP_BLK, HIS_BLK and LOG_BLK may be differently set to values corresponding to the respective program units PGM_UNIT of the user data U_DAT, the map data MAP_DAT, the history data HIS_DAT and the log data LOG_DAT, respectively. In some embodiments, the threshold values TH may be differently set to values corresponding to values N times greater than the respective program units PGM_UNIT, where N is a natural number greater than or equal to 2.

Referring to FIG. 5B, the threshold values TH of the plurality of open blocks U_BLK, MAP_BLK, HIS_BLK and LOG_BLK may be set to a value corresponding to the largest program unit PGM_UNIT among the program units PGM_UNIT of the user data U_DAT, the map data MAP_DAT, the history data HIS_DAT and the log data LOG_DAT, respectively.

In the illustrated example in FIG. 5B, the threshold values TH may be equally set to 'five pages' corresponding to the program unit PGM_UNIT of the user data U_DAT, which is the largest program unit PGM_UNIT. In some embodiments, the threshold values TH may be equally set to a value N times greater than the largest program unit PGM_UNIT, where N is a natural number greater than or equal to 2.

In some embodiments, the program unit PGM_UNIT of the user data U_DAT may be set to the maximum value of the size of the user data U_DAT which is requested once by the host, for example, 512 bytes. The number of programmable pages PGM_P in one first free block FR_BLK1 may be greater than the program unit PGM_UNIT of the user data U_DAT.

In some embodiments, the map data MAP_DAT, the history data HIS_DAT and the log data LOG_DAT may be temporarily stored in the memory 144 of the controller 130, and updated and managed by the controller 130. Furthermore, when the program periods of the map data MAP_DAT, the history data HIS_DAT and the log data LOG_DAT arrive, the map data MAP_DAT, the history data HIS_DAT and the log data LOG_DAT may be programmed to the corresponding open blocks MAP_BLK, HIS_BLK and LOG_BLK according to the respective program units PGM_UNIT.

Figure 6A:
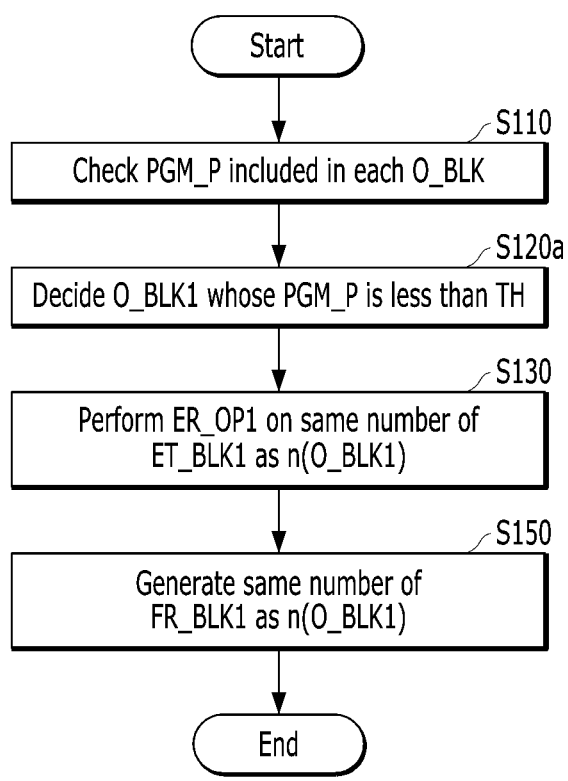
FIGS. 6A and 6B are flowcharts illustrating a method of generating a first free block in a controller in accordance with an embodiment of the present disclosure.

FIG. 6A illustrates an example of a first free block generation method for reducing a program operation time and write latency in accordance with an embodiment of the present disclosure. Hereafter, the first free block generation method of FIG. 6A is described with reference to the plurality of open blocks in FIGS. 5A and 5B.

Referring to FIG. 6A, in step S110, the controller 130 checks and monitors the number of programmable pages PGM_P in each of the plurality of open blocks O_BLK in the memory device 150. Step S110 may be performed after the user data U_DAT are programmed to the user open block U_BLK, or after the meta data such as the map data MAP_DAT, the history data HIS_DAT and the log data LOG_DAT are generated or updated in the memory 144 in the controller 130. That is, step S110 may be performed whenever the number of programmable pages in each of the plurality of open blocks O_BLK is changed.

In step S120a, the controller 130 decides first open blocks O_BLK1 in which the number of programmable pages PGM_P is less than the threshold value TH. In step S130, the controller 130 may perform a first erase operation ER_OP1 on first erase target blocks ET_BLK1 which are some of a plurality of erase target blocks ET_BLK, based on the number n(O_BLK1) of the first open blocks O_BLK1. In step S150, the controller 130 may generate first free blocks FR_BLK1. In particular, the controller 130 may generate the same number of first free blocks FR_BLK1 as the number n(O_BLK1) of the first open blocks by performing the first erase operation ER_OP1 on the same number of first erase target blocks ET_BLK1 as the number n(O_BLK1) of the first open blocks O_BLK1.

In an example of FIG. 5A, in step S120a the controller 130 may decide, as the first open blocks O_BLK1, the user open block U_BLK having four programmable pages PGM_P less than the threshold value TH of 'five pages' and the map open block MAP_BLK having one programmable page PGM_P less than the threshold value TH of 'three pages'. Since the number n(O_BLK1) of the first open blocks O_BLK1 is two, the controller 130 may perform the first erase operation ER_OP1 on the two first erase target blocks ET_BLK1 in step S130, and generate two first free blocks FR_BLK1 in step 150.

In an example of FIG. 5B, in step S120a, the controller 130 may decide, as the first open blocks O_BLK1, the user open block U_BLK, the map open block MAP_BLK, the history open block HIS_BLK and the log open block LOG_BLK, each of which has programmable pages PGM_P less than the threshold value TH of 'five pages'. Since the number n(O_BLK1) of the first open blocks O_BLK1 is four, the controller 130 may perform the first erase operation ER_OP1 on four first erase target blocks ET_BLK1 in step S130, and generate four first free blocks FR_BLK1 in step 150.

According to the first free block generation method illustrated in FIG. 6A, the controller 130 may perform the first erase operation ER_OP1 on the same number of first erase target blocks ET_BLK1 as the number n(O_BLK1) of the first open blocks O_BLK1 in step S130, and generate the first free blocks FR_BLK1 in step S150.

When the threshold values TH are set to values equal to the program units of the write data U_DAT, MAP_DAT, HIS_DAT and LOG_DAT stored in the plurality of open blocks U_BLK, MAP_BLK, HIS_BLK and LOG_BLK, respectively, the controller 130 may not perform an erase operation for generating the second free block FR_BLK2 during a program operation according to the write request WT_REQ received from the host 102, because the number of first open blocks to be closed is equal to the number of the generated first free blocks FR_BLK1.

Therefore, the first free block generation method illustrated in FIG. 6A may reduce the program operation time because an erase operation time required for securing a second free block to perform a program operation is not needed. Furthermore, since the generated first free blocks FR_BLK1 may be allocated one-to-one to the respective first open blocks to be closed, the first free blocks FR_BLK1 may be allocated to the user open block U_BLK to which the user data U_DAT are programmed. Thus, as the program operation time of the memory system 110 is reduced, the write latency may also be reduced.

The meta data, such as the map data MAP_DAT, the history data HIS_DAT and the log data LOG_DAT, except the user data U_DAT may be temporarily stored in the memory 144 in the controller 130, and updated and managed by the controller 130. When the program periods of the map data MAP_DAT, the history data HIS_DAT and the log data LOG_DAT arrive, the map data MAP_DAT, the history data HIS_DAT and the log data LOG_DAT may be respectively programmed to the corresponding open blocks MAP_BLK, HIS_BLK and LOG_BLK according to the respective program units PGM_UNIT.

When the program periods of the meta data such as the map data MAP_DAT, the history data HIS_DAT and the log data LOG_DAT do not arrive during the program operation according to the write request WT_REQ received from the host 102, the controller 130 may only generate and update the meta data into the memory 144, without performing a program operation. That is, the controller 130 may not perform program operations on the first free blocks FR_BLK1 generated for program operations of the meta data open blocks MAP_BLK, HIS_BLK and LOG_BLK. Then, with the elapse of time, the threshold voltage distribution of memory cells in the first free block FR_BLK1 which has been already generated may be changed to degrade the characteristics of erase pages. Thus, the reliability of the write data WT_DAT stored in the first free block FR_BLK1 may also be degraded.

Figure 6B:
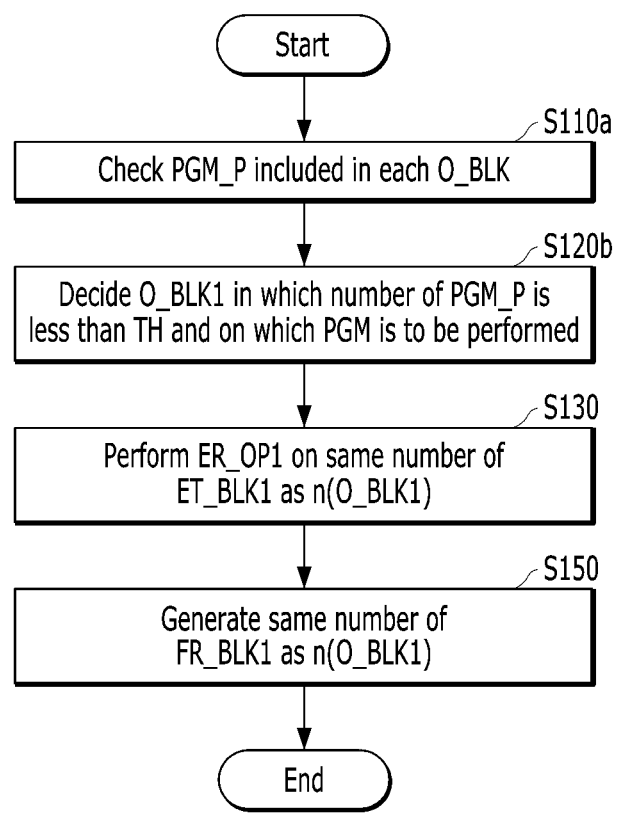

Therefore, as shown in FIG. 6B, a method for generating a first free block FR_BLK1 is described, which may improve the reliability of write data WT_DAT while reducing a program operation time and the write latency.

Referring to FIG. 6B, in step S110a, the controller 130 monitors and checks the number of programmable pages PGM_P in each of the plurality of open blocks O_BLK in the memory device 150. Step S110a may be performed after the user data U_DAT are programmed to the user open block U_BLK or after meta data such as the map data MAP_DAT, the history data HIS_DAT and the log data LOG_DAT are generated or updated in the memory 144 in the controller 130.

When the number of programmable pages PGM_P monitored in step S110 is less than the threshold value TH, the controller 130 may decide, as the first open block O_BLK1, an open block O_BLK on which a program operation is to be performed, in step S120b.

Since a program operation for the user data U_DAT is performed whenever the write request WT_REQ is received from the host 102, the controller 130 may determine the user open block U_BLK is the first open block O_BLK1.

Program operations for the meta data MAP_DAT, HIS_DAT and LOG_DAT may not be performed whenever the write request WT_REQ is received from the host 102. Thus, the controller 130 may check the program periods of the meta data MAP_DAT, HIS_DAT and LOG_DAT.

The controller 130 may perform a program operation to flush the meta data MAP_DAT, HIS_DAT or LOG_DAT, when the size of an empty space having no meta data stored therein in a storage space which is included in the memory 144 and allocated to store the meta data MAP_DAT, HIS_DAT or LOG_DAT is less than or equal to a preset size. Therefore, the controller 130 may determine that the program period of the meta data stored in the storage space whose empty space is less than or equal to the preset size has arrived. Thus, the controller 130 may decide, as the first open block O_BLK1, the meta open block MAP_BLK in which the meta data whose program period has arrived are stored, in step S120b.

In step S130, the controller 130 may perform the first erase operation ER_OP1 on the first erase target block ET_BLK1 which is a part of the plurality of erase target blocks ET_BLK, based on the number n(O_BLK1) of the first open blocks. The controller 130 may generate the first free block FR_BLK1 in step S150. In particular, the controller 130 may generate the same number of first free blocks FR_BLK1 as the number n(O_BLK1) of the first open blocks by performing the first erase operation ER_OP1 on the same number of first erase target blocks ET_BLK1 as the number n(O_BLK1) of the first open blocks.

In an example of FIG. 5A, the program period of the map open block MAP_BLK between the map open block MAP_BLK and the user open block U_BLK, each of which includes programmable pages PGM_P less than the threshold value TH, will arrive. In this case, the controller 130 may determine that a program operation will be performed on the user open block U_BLK and the map open block MAP_BLK according to the write request WT_REQ to be received from the host 102 later. Thus, the controller 130 may perform the first erase operation ER_OP1 on two first erase target blocks ET_BLK1 in step S130, and generate two first free blocks FR_BLK1 in step 150.

In an example of FIG. 5B, only the program period of the map open block MAP_BLK, among the user open block U_BLK, the map open block MAP_BLK, the history open block HIS_BLK and the log open block LOG_BLK, each of which includes programmable pages PGM_P less than the threshold value TH, will arrive, and the program periods of the history open block HIS_BLK and the log open block LOG_BLK do not arrive. In this case, the controller 130 may determine that a program operation will be performed on the user open block U_BLK and the map open block MAP_BLK according to the write request WT_REQ to be received later, and a program operation will not be performed on the history block HIS_BLK and the log open block LOG_BLK. Thus, the controller 130 may perform the first erase operation ER_OP1 on two first erase target blocks ET_BLK1 in step S130, and generate two first free blocks FR_BLK1 in step 150.

When the threshold values TH are set to values equal to the program units of the write data U_DAT, MAP_DAT, HIS_DAT and LOG_DAT stored in the plurality of open blocks U_BLK, MAP_BLK, HIS_BLK and LOG_BLK, respectively, the controller 130 may not perform an erase operation for generating the second free block FR_BLK2 during the program operation according to the write request WT_REQ received from the host 102, because the number of first open blocks which are to be closed and on which the program operation is to be performed is equal to the number of generated first free blocks FR_BLK1.

Therefore, the first free block generation method illustrated in FIG. 6B may reduce the program operation time because an erase operation time required for securing a second free block to perform a program operation is not needed. Furthermore, since the generated first free blocks FR_BLK1 may be allocated one-to-one to the respective first open blocks which are closed by program operations, the first free blocks FR_BLK1 may be allocated as the user open block U_BLK to which the user data U_DAT are programmed. Therefore, the write latency of the memory system 110 may be reduced.

In particular, the first free block generation method of FIG. 6B may determine the number of first open blocks O_BLK1 according to the accurate numbers of the user open block U_BLK and the meta open blocks MAP_BLK, HIS_BLK and LOG_BLK, in which the numbers of programmable page PGM_P are less than the threshold values and on which a program operation is to be performed according to the write request WT_REQ to be received from the host 102 later. Therefore, the program operation may be performed on all of the first free blocks FR_BLK1 which are generated based on the number of the first open blocks O_BLK1. Thus, since the time point that the first free block is generated is not much different from the time point that a program operation is performed on the first free block, the threshold voltage distribution of memory cells in the generated first free block FR_BLK1 may not be changed. Therefore, the characteristics of erase pages in the first free block FR_BLK1 may not be degraded, and the reliability of the write data WT_DAT stored in the first free block FR_BLK1 may not be degraded either.

The present disclosure may include an embodiment capable of preventing the case in which the program operation time has the maximum value, while generating a minimum number of first free blocks in consideration of the characteristic of the first free block whose reliability is reduced with the elapse of time, i.e. a change in threshold voltage distribution of memory cells included in erase pages thereof.

FIG. 7 illustrates an example of a first free block generation method for preventing the case in which the program operation time has the maximum value. The case in which the program operation time has the maximum value may indicate the case in which an erase operation is performed on the same number of erase target blocks as the number of a plurality of different write data WT_DAT, while a program operation for the plurality of different write data WT_DAT is performed.

Figure 7A:
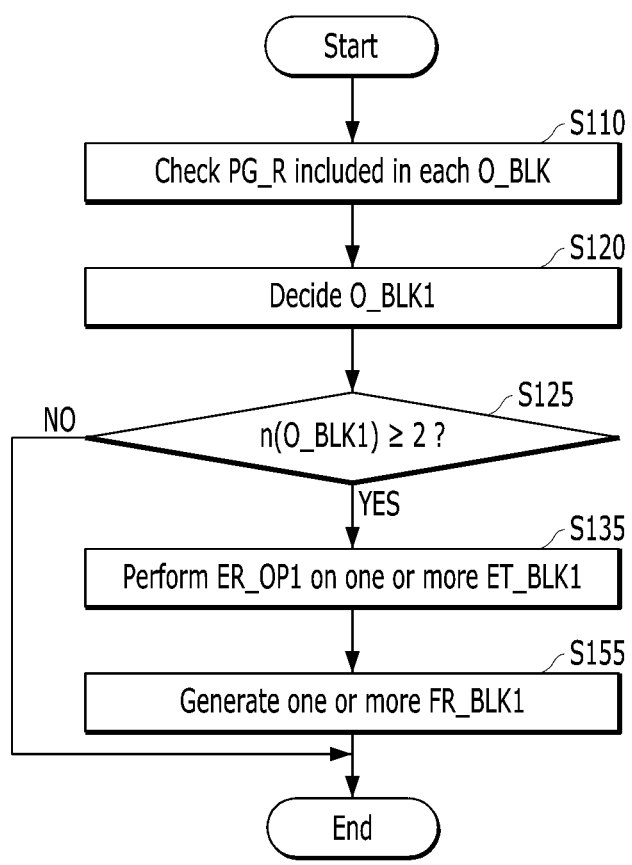
FIG. 7A is a flowchart illustrating a method of generating and allocating a first free block in a controller in accordance with an embodiment of the present disclosure.

Since steps S110 and S120 of FIG. 7A are performed in the same manner as steps S110 and S120 of FIG. 6A, the descriptions thereof are omitted herein.

In step S125, the controller 130 determines whether the number n(O_BLK1) of first open blocks decided in step S120 is greater than or equal to two.

When the determination result of step S125 indicates that the number n(O_BLK1) of first open blocks is greater than or equal to two (YES in step S125), the controller 130 may perform the first erase operation ER_OP1 on one or more first erase target blocks ET_BLK1 in step S135. Further, the controller 130 may generate one or more first free blocks FR_BLK1 in step S155. The number of the first free blocks FR_BLK1 generated in step S155 may be greater than or equal to one and less than or equal to the number n(O_BLK1) of first open blocks.

When the determination result of step S125 indicates that the number n(O_BLK1) of first open blocks is less than two (NO in step S125), the controller 130 neither performs the first erase operation in step S135, nor generates the first free block FR_BLK1.

When the first free block generation method illustrated in FIG. 7A is applied to the four open blocks U_BLK, MAP_BLK, HIS_BLK and LOG_BLK illustrated in FIGS. 5A and 5B, the controller 130 may generate one or more first free blocks FR_BLK1 in step S155 after performing the first erase operation ER_OP1 on one or more first erase target blocks ET_BLK1 in step S135, because the number n(O_BLK1) of first open blocks is greater than or equal to two (two in FIG. 5A and four in FIG. 5B).

In particular, during the program operation according to the write request WT_REQ in FIG. 5B, the controller 130 may not generate four second free blocks FR_BLK2, but generate three second free blocks FR_BLK2, even though the controller 130 determines that the number of first open blocks O_BLK1 to be closed is four. That is, since the erase operation for generating the second free blocks FR_BLK2 is performed on only three erase target blocks, not four erase target blocks, the controller 130 may prevent the case in which the program operation time has the maximum value.

However, when the one or more first free blocks FR_BLK1 generated in step S155 are not allocated to the user open block U_BLK on which a program operation for the user data U_DAT is performed, but allocated to a meta open block on which a program operation for meta data is performed, the controller 130 needs to perform the second erase operation on one erase target block in order to generate the second free block FR_BLK2 during the program operation for the user data U_DAT. Thus, the program operation time of the user data U_DAT may be increased, and the write latency may be increased.

When the program period of meta data does not arrive even though the one or more first free blocks FR_BLK1 generated in step S155 are allocated to a meta open block on which a program operation for the meta data is performed, the program operation for the meta data may not be performed on the generated first free block FR_BLK1.

Therefore, the present disclosure may include an embodiment of the first free block generation method which may reduce the write latency while preventing the case in which the program operation time has the maximum value.

Figure 7B:
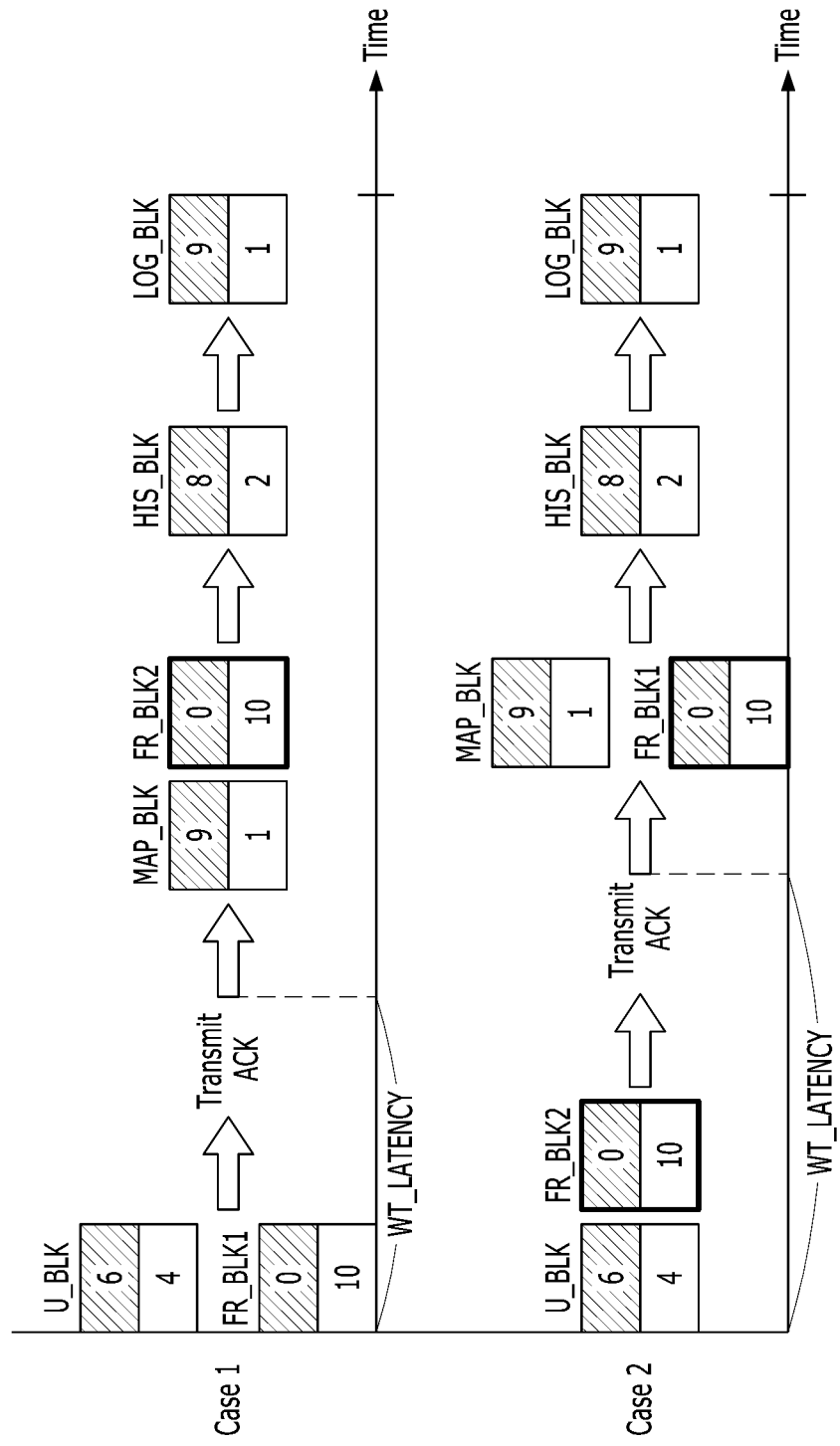
FIG. 7B illustrates a method for allocating a generated first free block to a first open block in accordance with the present embodiment.

FIG. 7B illustrates a method for allocating a generated first free block to a first open block in accordance with the present embodiment. In particular, an operation of allocating the first free block, which is described with reference to FIG. 7B, may be performed between the time point that the first erase operation illustrated in FIG. 2B is performed and the second time point T2.

The controller 130 may determine whether the number n(O_BLK1) of first open blocks each including programmable pages PGM_P less than the threshold value TH is smaller than the number n(FR_BLK1) of generated first free blocks.

When the determination result indicates that the number n(O_BLK1) of first open blocks is not less than the number n(FR_BLK1) of first free blocks, the controller 130 may determine that the number n(O_BLK1) of first open blocks is equal to the number n(FR_BLK1) of first free blocks, and allocate the first free blocks FR_BLK1 one-to-one to the first open blocks O_BLK1. This operation may correspond to the first free block generation method described with reference to FIGS. 6A and 6B.

When the determination result indicates that the number n(O_BLK1) of first open blocks is less than the number n(FR_BLK1) of first free blocks, the controller 130 may preferentially allocate the first free blocks FR_BLK1 according to the priority of the first open blocks O_BLK1.

In the present embodiment, the controller 130 may increase the allocation priority of the first open block O_BLK1 on which a program operation is first performed, among the first open blocks O_BLK1. When the program operations for the write data WT_DAT are sequentially performed in order of the user data U_DAT, the map data MAP_DAT, the history data HIS_DAT and the log data LOG_DAT and the user open block U_BLK is included in the first open blocks O_BLK1, the controller 130 may increase the allocation priority of the user open block U_BLK on which the program operation is first performed. Therefore, during the program operations for the write data WT_DAT, the first free block FR_BLK1 may be preferentially allocated to the user open block U_BLK, which makes it possible to reduce the write latency.

In the present embodiment, the controller 130 may increase the allocation priority of the user open block U_BLK having the user data U_DAT stored therein, among the first open blocks O_BLK1. As illustrated in FIG. 5A, the first open block O_BLK1 having programmable pages PGM_P less than the threshold value TH, among the plurality of open blocks U_BLK, MAP_BLK, HIS_BLK and LOG_BLK, may include the user data block U_BLK and the map data block MAP_BLK. The controller 130 may increase the allocation priority of the user open block U_BLK having the user data U_DAT stored therein to a higher priority than that of the map data block MAP_BLK. Therefore, during the program operations for the write data WT_DAT, the first free block FR_BLK1 may be preferentially allocated to the user open block U_BLK, which makes it possible to reduce the write latency.

Referring to CASE 1 in FIG. 7B, the controller 130 may increase the allocation priority of the first open block O_BLK1 whose program unit PGM_UNIT has a large size, among the first open blocks O_BLK1. When the program units PGM_P of the write data WT_DAT have a relationship of (user data U_DAT>map data MAP_DAT>history data HIS_DAT>log data LOG_DAT) and the user open block U_BLK is included in the first open blocks O_BLK1, the controller 130 may increase the allocation priority of the user open block U_BLK having the largest program unit PGM_UNIT. Therefore, during the program operations for the write data WT_DAT, the first free block FR_BLK1 may be preferentially allocated to the user open block U_BLK, which makes it possible to reduce the write latency.

As described above, when the first free block FR_BLK1 is preferentially allocated to the user data block U_BLK, an erase operation does not need to be performed on an erase target block during a program operation for the user data U_DAT. That is, the program operation time required for programming the user data U_DAT may be reduced, and the write latency may also be reduced. Thus, the controller 130 may transmit an acknowledgement of the write request WT_REQ to the host within the host latency. Referring to CASE 2 in FIG. 7B, the controller 130 may increase the allocation priority of the first open block O_BLK1 in which meta data whose program period arrives are stored, among the first open blocks O_BLK1.

That is, the controller 130 may increase the allocation priority of a first open block having a large program unit PGM_UNIT and a small number of programmable pages PGM_P.

For example, as illustrated in FIG. 5A, the number of programmable pages PGM_P in the user data block U_BLK corresponds to 'four pages', and the program unit PGM_U-NIT of the user data U_DAT corresponds to 'five pages'. Thus, a difference between the two values may correspond to 'one page'. The number of programmable pages PGM_P in the map data block MAP_BLK corresponds to 'one page', and the program unit PGM_UNIT of the map data MAP_DAT corresponds to 'three pages'. Thus, a difference between the two values may correspond to 'two pages'. Therefore, the controller 130 may raise the allocation priority of the map data block MAP_BLK to a higher priority than that of the user data block U_BLK.

As described above, when the first free block FR_BLK1 is preferentially allocated to the map data block M_BLK, an erase operation does not need to be performed on an erase target block during a program operation for the map data block M_BLK. That is, the program operation time required for programming the map data block M_BLK may be reduced.

Figure 8:
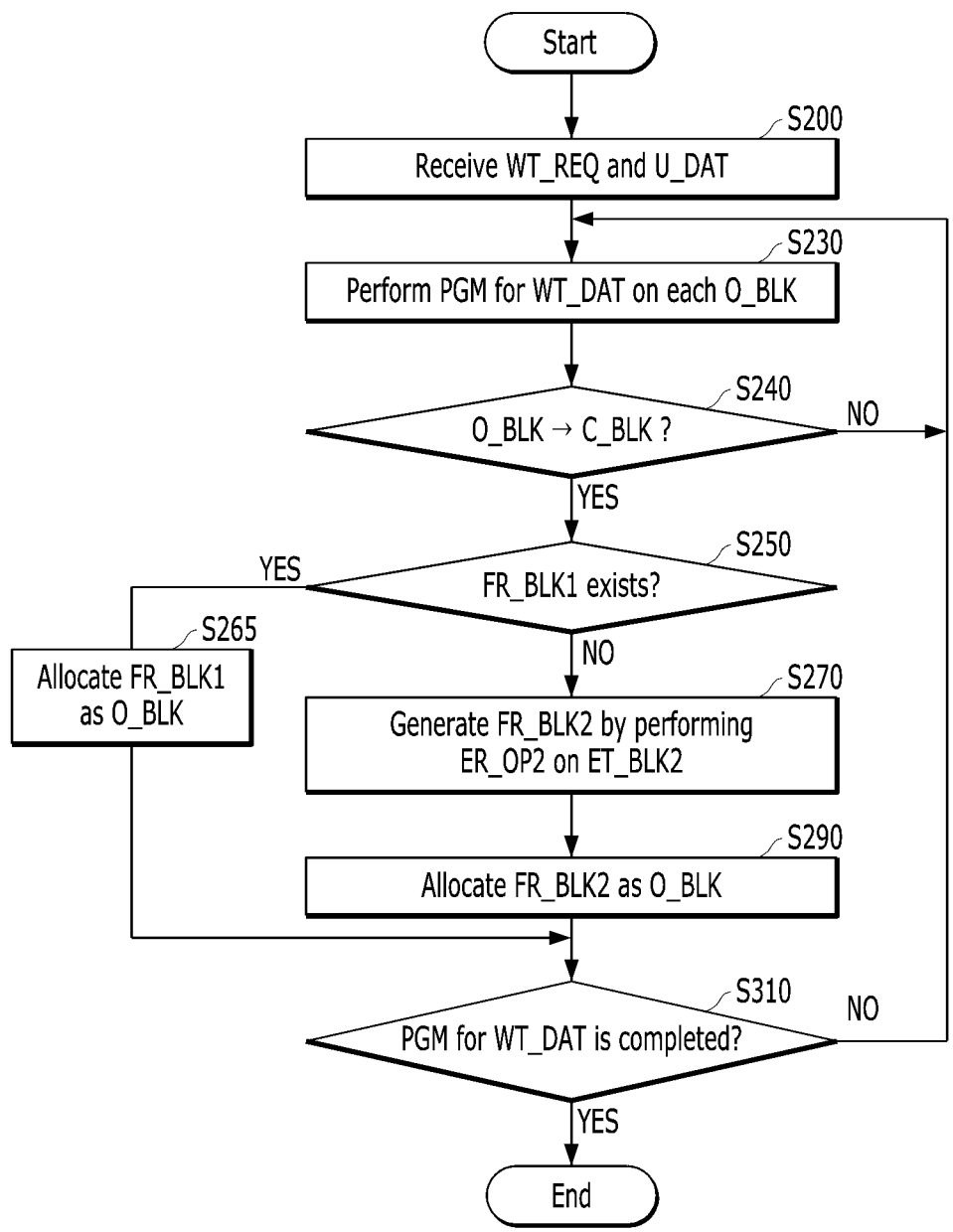
FIG. 8 is a flowchart illustrating a program operation method of the memory system in accordance with an embodiment of the present disclosure.

FIG. 8 illustrates an example of the program operation method performed by the controller 130 in accordance with an embodiment of the present disclosure.

Referring to FIG. 8, the controller 130 may receive a write request WT_REQ with user data U_DAT from the host in step S200. The controller 130 may perform program (PGM) operations for the write data WT_DAT to the plurality of open blocks O_BLK, respectively, in step S230. The program operations for the write data WT_DAT may be sequentially performed in order of the user data U_DAT, the map data MAP_DAT, the history data HIS_DAT and the log data LOG_DAT.

During the program operations for the write data WT_DAT of FIG. 8, when the previously generated first free block FR_BLK1 is not preferentially allocated to a specific open block according to the allocation method described with reference to FIG. 7B, the controller 130 may allocate the first free block FR_BLK1 as an open block, as necessary, while sequentially performing the program operations for the write data WT_DAT.

The controller 130 may determine whether the open block O_BLK is changed to a closed block C_BLK by the program operation of step S230, in step S240. When data are programmed to all programmable pages PGM_P in each of the open blocks O_BLK, the open block O_BLK may be changed to the closed block C_BLK.

When the determination result of step S240 indicates that the open block O_BLK is not changed to the closed block C_BLK (NO), the controller 130 may return to step S230 to perform a program operation.

When the determination result of step S240 indicates that the open block O_BLK on which the program operation is being performed is changed to the closed block C_BLK, the controller 130 may determine whether the previously generated first free block FR_BLK1 exists, in step S250. When the determination result of step S250 indicates that the first free block FR_BLK1 exists, the controller 130 may allocate the first free block FR_BLK1 as the open block O_BLK in step S265.

The controller 130 may determine whether the program operation for the write data WT_DAT is completed, in step S310. When the determination result of step S310 indicates that the program operation for the write data WT_DAT is not completed (NO), the controller 130 may return to step S230 to perform a program operation on the open block O_BLK to which the first free block FR_BLK1 is allocated.

When the determination result of step S250 indicates that the first free block FR_BLK1 does not exist (NO), the controller 130 may generate a second free block FR_BLK2 by performing the second erase operation ER_OP2 on the second erase target block ET_BLK2 on which an erase operation has never been performed, in step S270.

The controller 130 may allocate the generated second free block FR_BLK2 as an open block O_BLK in step S290. The controller 130 may determine whether the program operation of the write data WT_DAT are completed, in step S310. When the determination result of step S310 indicates that the program operation for the write data WT_DAT are not completed, the controller 130 may return to step S230 to perform a program operation on the open block O_BLK to which the second free block FR_BLK2 is allocated.

FIG. 9 illustrates a specific example of the program operation method which is performed on a plurality of open blocks as described with reference to FIG. 8.

By way of example and without any limitation, FIG. 9 illustrates that the first free blocks FR_BLK1 generated by the method described with reference to FIGS. 7A and 7B are allocated to the plurality of open blocks illustrated in FIG. 5A, while the program operation method described with reference to FIG. 8 is performed.

Hereafter, referring to FIGS. 5A, 7A, 7B, 8 and 9, a specific example in which program operations are performed on the plurality of open blocks is described.

Among the plurality of open blocks U_BLK, MAP_BLK, HIS_BLK and LOG_BLK, the first open blocks O_BLK1 each having programmable pages PGM_P less than the threshold value TH may be the user open block U_BLK and the map open block MAP_BLK. Thus, since the user open block U_BLK and the map open block MAP_BLK are supposed to be closed blocks C_BLK by a program operation according to a write request later, two second free blocks FR_BLK2 need to be generated during the program operation. However, one first free block FR_BLK1 was previously generated as described with reference to FIGS. 7A and 7B. Thus, during the program operation, only one second free block FR_BLK2 may be generated.

The controller 130 may receive the write request WT_REQ with the user data U_DAT from the host 102. Thus, the controller 130 may perform a program operation for the write data WT_DAT associated with the write request WT_REQ. The program operation for the write data WT_DAT may include a program operation for the user data U_DAT, which is performed on the user open block U_BLK, and program operations for the meta data M_DAT associated with the user data U_DAT.

The program operations for the meta data M_DAT may be sequentially performed after the program operation for the user data U_DAT. The program operations for the meta data M_DAT may include a program operation for the map data MAP_DAT associated with location information of the completely programmed user data U_DAT, a program operation for the history data HIS_DAT associated with location information of the completely programmed map data MAP_DAT, and a program operation for the log data LOG_DAT associated with location information of the completely programmed history data HIS_DAT.

In STEP1, the controller 130 may first perform the program operation for the user data U_DAT among the program operations for the write data WT_DAT. The number of programmable pages PGM_P in the user open block U_BLK may correspond to 'four pages', and the program unit PGM_UNIT of the user data U_DAT may correspond to 'five pages'. The controller 130 programs the user data U_DAT of 'four pages', among the user data U_DAT corresponding to 'five pages', to the four programmable pages PGM_P. Thus, the number of programmable pages PGM_P in the user open block U_BLK may become '0', such that the user open block U_BLK becomes a closed block C_BLK. At this time, a program operation for the user data U_DAT of 'one page' has not yet been performed.

In STEP2, the controller 130 may allocate one previously generated first free block FR_BLK1 as the user open block U_BLK. The number of programmable pages PGM_P in the first free block FR_BLK1 may correspond to '10 pages'.

The controller 130 may determine whether the program operation for the user data U_DAT is completed. Since the program operation for the user data U_DAT having a size of 'one page' has not yet been performed in STEP1, the controller 130 may determine that the program operation for the user data U_DAT is not completed.

In STEP3, the controller 130 may perform the program operation for the user data U_DAT having a size of 'one page' on the first free block FR_BLK1 allocated as the user open block U_BLK.

In STEP4, the controller 130 may determine that the program operation for the user data U_DAT is completed, and transmit an acknowledgement ACK for the write request to the host.

Then, the controller 130 may perform the program operation for the meta data M_DAT.

In STEP5, the controller 130 may first perform the program operation for the map data MAP_DAT among the program operations for the meta data M_DAT. The number of programmable pages PGM_P in the map open block MAP_BLK may correspond to 'one page', and the program unit PGM_UNIT of the map data MAP_DAT may correspond to 'three pages'. The controller 130 programs the map data MAP_DAT of 'one page', among the map data MAP_DAT corresponding to 'three pages', to one programmable page PGM_P. Thus, the number of programmable pages PGM_P in the map open block MAP_BLK may become '0', such that the map open block MAP_BLK becomes a closed block C_BLK. At this time, a program operation for the map data MAP_DAT of 'two pages' has not yet been performed.

In STEP6, the controller 130 may generate one second free block FR_BLK2 by performing an erase operation on one second erase target block ER_BLK2.

In STEP6, the controller 130 may allocate the generated second free block FR_BLK2 as the map open block MAP_BLK. The number of programmable pages PGM_P in the second free block FR_BLK2 may correspond to '10 pages'.

The controller 130 may determine whether the program operation for the map data MAP_DAT is completed. Since the program operation for the map data MAP_DAT having a size of 'two pages' has not been yet performed in STEP5, the controller 130 may determine that the program operation for the map data MAP_DAT is not completed.

In STEP7, the controller 130 may perform the program operation for the map data MAP_DAT having a size of 'two pages' on the second free block FR_BLK2 allocated as the map open block MAP_BLK.

In STEP8, the controller 130 may determine that the program operation for the map data MAP_DAT is completed, and then perform the program operation for the history data HIS_DAT. In STEP8, the controller 130 programs the history data HIS_DAT of 'two pages' to 'two' programmable pages PGM_P. Thus, the number of programmable pages PGM_P in the history open block HIS_BLK may become '0', such that the history open block HIS_BLK becomes a closed block C_BLK.

In STEP9, the controller 130 may determine that the program operation for the history data HIS_DAT is completed, and then perform the program operation for the log data LOG_DAT. As illustrated in STEP9, the controller 130 programs the log data LOG_DAT of 'one page' to 'one' programmable page PGM_P. Thus, the number of programmable pages PGM_P in the log open block LOG_BLK becomes '0', such that the log open block LOG_BLK becomes a closed block C_BLK, and the program operation for the log data LOG_DAT is completed.

Through the operations of STEP1 to STEP9, the program operation according to the write request WT_REQ from the host may be completed.

When the program operation in FIG. 9 is performed, the erase operation for generating the second free blocks to perform the program operation may be performed on not m erase target blocks corresponding to the maximum number m of open blocks, but only on at least one erase target block or a maximum of (m−1) erase target blocks, which makes it possible to prevent the case in which the program operation time has the maximum value (the case in which the erase operation is performed on m erase target blocks). Furthermore, since the first free block is allocated as the user open block, the program operation time (i.e., write (WT) latency) of the user data U_DAT may be reduced (STEP1 to STEP4). Therefore, an acknowledgement of the write request of the host may be rapidly transmitted to the host.

Since only the program operations for some data of the write data WT_DAT are performed on the first free blocks and the program operations for the other data are performed on the second free blocks which are generated after a write request is received from the host, the reliability of the programmed write data WT_DAT may be increased more than when all of the program operations for the write data WT_DAT are performed on the first free blocks.

Although various embodiments have been described for illustrative purposes, it will be apparent to those skilled in the art that various changes and modifications may be made without departing from the spirit and scope of the invention as defined in the following claims.

What is claimed is:

1. An operation method of a memory system, comprising:
monitoring a programmable area in each of a plurality of open blocks in which a plurality of data having different attributes to be programmed by one write request are stored, respectively when a size of the programmable area is changed; and
generating a first free block by performing a first erase operation on a part of a plurality of erase target blocks, based on the number of prospective closed blocks among the plurality of open blocks, each prospective closed block having the size of the programmable area less than a threshold value before a next write request from a host,
wherein the prospective closed block includes the programmable area to which data can be programmed and a programmed area in which any one of the plurality of data is completely programmed.

2. The operation method of claim 1, further comprising:
programming the plurality of data having different attributes to the plurality of open blocks according to the next write request received from the host; and
securing the plurality of open blocks by changing the state of the first free block to the state of an open block, when the state of at least a part of the plurality of open blocks is changed to the state of a closed block by the programming of the plurality of data.

3. The operation method of claim 2, further comprising:
generating a second free block by performing a second erase operation on another part of the plurality of erase target blocks, when there is no first free block whose state is changed to the state of the open block; and
securing the plurality of open blocks by changing the state of the second free block to the state of the open block.

4. The operation method of claim 2, wherein the plurality of data comprise user data programmed by a write request from the host and meta data associated with the user data, wherein the user data are programmed to a user open block among the plurality of open blocks, and the meta data are programmed in a meta open block.

5. The operation method of claim 4, wherein the securing of the plurality of open blocks comprises allocating the first free block as the user open block when the number of the first free blocks is less than the number of the prospective closed blocks.

6. The operation method of claim 5, further comprising:
programming the user data to the user open block;
transmitting an acknowledgement for the write request to the host; and
generating the meta data for the programmed user data, and programming the meta data to the meta open block.

7. The operation method of claim 5, wherein the securing of the plurality of open blocks comprises allocating the first free block as the prospective closed block for storing data that is stored in a large program unit, among the prospective closed blocks.

8. The operation method of claim 5, wherein the securing the plurality of open blocks comprises allocating the first free block as the meta open block for storing the meta data on which the program operation is to be performed based on a program period.

9. The operation method of claim 1, wherein the generating of the first free block comprises generating the one or more first free blocks when the number of the prospective closed blocks is greater than or equal to a set value.

10. The operation method of claim 1, wherein the generating of the first free block comprises setting the threshold value based on program units of the plurality of data, wherein the threshold value has a value greater than 0.

11. The operation method of claim 10, wherein the generating of the first free block comprises differently setting threshold values for the plurality of open blocks to values which are equal to or N times greater than the program units of the respective open blocks, where N is a natural number greater than or equal to 1.

12. The operation method of claim 10, wherein the generating of the first free block comprises equally setting the threshold values for the plurality of open blocks to a value which is equal to or N times greater than the largest program unit among the program units of the respective open blocks, where N is a natural number greater than or equal to 2.

13. A memory system comprising:
a memory device comprising a plurality of erase target blocks and a plurality of open blocks each having a plurality of data stored therein, the plurality of data having different attributes to be programmed by one write request; and
a controller suitable for generating a first free block by performing a first erase operation on a part of the plurality of erase target blocks when a size of the programmable area is changed, based on the number of prospective closed blocks among the plurality of open blocks each prospective closed block having a size of a programmable area less than a threshold value before a next write request from a host,
wherein the prospective closed block includes the programmable area to which data can be programmed and a programmed area in which any one of the plurality of data is completely programmed.

14. The memory system of claim 13, wherein when the state of at least a part of the plurality of open blocks is changed to the state of a closed block while the plurality of data having different attributes are programmed to the plurality of open blocks according to a write request received from a host, the controller secures the plurality of open blocks by changing the state of the first free block to the state of the open block.

15. The memory system of claim 14, wherein, when there is no first free block whose state is changed to the state of the open block, the controller generates a second free block by performing a second erase operation on another part of the plurality of erase target blocks, and secures the plurality of open blocks by changing the state of the second free block to the state of the open block.

16. The memory system of claim 14, wherein the plurality of data comprise user data programmed by a write request from the host and meta data associated with the user data, wherein the user data are programmed to a user open block among the plurality of open blocks, and the meta data are programmed in a meta open block.

17. The memory system of claim 16, wherein, when the number of the first free blocks is less than the number of the prospective closed blocks, the controller allocates the first free block as the user open block.

18. The memory system of claim 17, wherein the controller programs the user data to the allocated user open block, transmits an acknowledgement for the write request to the host, and generates the meta data associated with the programmed user data and programs the meta data to the meta open block.

19. The memory system of claim 17, wherein the controller allocates the first free block as the prospective closed block for storing data that is stored in a large program unit, among the prospective closed blocks.

20. The memory system of claim 17, wherein the controller allocates the first free block as the meta open block for storing the meta data on which the program operation is to be performed based on a program period.

21. The memory system of claim 13, wherein when the number of the prospective closed blocks is greater than or equal to a set value, the controller generates the one or more first free blocks.

22. The memory system of claim 13, wherein the controller sets the threshold value based on the program units of the plurality of data, wherein the threshold value has a value greater than 0.

23. The memory system of claim 22, wherein the controller differently sets threshold values for the plurality of open blocks to values which are equal to or N times greater than the program units of the respective open blocks, where N is a natural number greater than or equal to 1.

24. The memory system of claim 22, wherein the controller equally sets the threshold values for the plurality of open blocks to a value which is equal to or N times greater than the largest program unit among the program units of the respective open blocks, where N is a natural number greater than or equal to 2.

25. A memory system comprising:
a memory device including a plurality of memory blocks in which a plurality of data having different attributes to be programmed by one write request are stored; and
a controller coupled to the memory device, suitable for:
checking an empty space of each memory block;
determining two or more target blocks among the plurality of memory blocks, each target block having an empty space less than a threshold;
pre-generating free blocks based on the number of the determined target blocks before a next write request from a host; and
allocating one of the free blocks to the determined target for a program operation according to the next write request,
wherein the target blocks include the programmable area to which data can be programmed and a programmed area in which any one of the plurality of data is completely programmed.

* * * * *